United States Patent
Oda et al.

(10) Patent No.: US 10,991,725 B2
(45) Date of Patent: Apr. 27, 2021

(54) ACTIVE MATRIX SUBSTRATE AND METHOD FOR PRODUCING SAME

(71) Applicant: Sharp Kabushiki Kaisha, Sakai (JP)

(72) Inventors: Akihiro Oda, Sakai (JP); Yujiro Takeda, Sakai (JP); Shogo Murashige, Sakai (JP); Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 28 days.

(21) Appl. No.: 16/491,229

(22) PCT Filed: Mar. 2, 2018

(86) PCT No.: PCT/JP2018/008062
§ 371 (c)(1),
(2) Date: Dec. 9, 2019

(87) PCT Pub. No.: WO2018/163997
PCT Pub. Date: Sep. 13, 2018

(65) Prior Publication Data
US 2020/0243568 A1 Jul. 30, 2020

(30) Foreign Application Priority Data
Mar. 9, 2017 (JP) .............................. JP2017-044643

(51) Int. Cl.
*H01L 21/00* (2006.01)
*H01L 27/00* (2006.01)
(Continued)

(52) U.S. Cl.
CPC ...... *H01L 27/1225* (2013.01); *H01L 21/0217* (2013.01); *H01L 21/02164* (2013.01);
(Continued)

(58) Field of Classification Search
CPC .......... H01L 21/02565; H01L 21/0217; H01L 21/02164; H01L 27/1248; H01L 27/1288;
(Continued)

(56) References Cited

U.S. PATENT DOCUMENTS 8,243,873 B2 * 8/2012 Koyama .............. G09G 3/2092
377/78
8,643,008 B2 * 2/2014 Yamazaki ........... H01L 27/1225
257/43
(Continued)

FOREIGN PATENT DOCUMENTS

JP 2006-119404 A 5/2006
JP 2008-032899 A 2/2008
(Continued)

*Primary Examiner* — Nikolay K Yushin
(74) *Attorney, Agent, or Firm* — Keating & Bennett, LLP

(57) ABSTRACT

An active matrix substrate includes: a substrate (1); a peripheral circuit including a plurality of first TFTs (10); and a plurality of second TFTs (20), wherein each of the first and second TFTs (10, 20) includes: a gate electrode (3A, 3B); a gate insulating layer (5); an oxide semiconductor layer (7A, 7B) including a channel region (7Ac, 7Bc), a source contact region (7As, 7Bs) and a drain contact region (7Ad, 7Bd), wherein the source contact region and the drain contact region are located on opposite sides of the channel region; a source electrode (8A, 8B) that is in contact with the source contact region and a drain electrode (9A, 9B) that is in contact with the drain contact region; the oxide semiconductor layer of the first TFTs and the second TFTs is formed from the same oxide semiconductor film; a carrier concentration in the channel regions (7Ac) of the first TETs is higher than a carrier concentration in the channel regions (7Bc) of the second TETs.

19 Claims, 10 Drawing Sheets

(51) Int. Cl.
- *H01L 29/00* (2006.01)
- *H01L 27/12* (2006.01)
- *H01L 21/02* (2006.01)
- *H01L 29/24* (2006.01)
- *H01L 29/417* (2006.01)
- *H01L 29/66* (2006.01)
- *H01L 29/786* (2006.01)

(52) U.S. Cl.
CPC .... *H01L 21/02565* (2013.01); *H01L 27/1248* (2013.01); *H01L 27/1288* (2013.01); *H01L 29/24* (2013.01); *H01L 29/41733* (2013.01); *H01L 29/66969* (2013.01); *H01L 29/7869* (2013.01); *H01L 29/78696* (2013.01)

(58) Field of Classification Search
CPC ........... H01L 27/1225; H01L 29/78696; H01L 29/786; H01L 29/7869; H01L 29/41733; H01L 29/24; H01L 29/66969; G09F 9/30
See application file for complete search history.

(56) References Cited

U.S. PATENT DOCUMENTS

| | | |
|---|---|---|
| 2008/0024416 A1 | 1/2008 | Onogi et al. |
| 2008/0035920 A1 | 2/2008 | Takechi et al. |
| 2008/0225024 A1 | 9/2008 | Ito |
| 2009/0261325 A1 | 10/2009 | Kawamura et al. |
| 2009/0323005 A1 | 12/2009 | Ota |
| 2010/0102313 A1 | 4/2010 | Miyairi et al. |
| 2011/0031496 A1 | 2/2011 | Yamazaki et al. |
| 2011/0069805 A1* | 3/2011 | Koyama ............... H01L 27/124 377/2 |
| 2012/0138922 A1 | 6/2012 | Yamazaki et al. |
| 2013/0020569 A1* | 1/2013 | Yamazaki ........... H01L 27/1225 257/43 |
| 2013/0038518 A1 | 2/2013 | Tagawa et al. |
| 2013/0200366 A1 | 8/2013 | Koyama et al. |
| 2013/0320334 A1 | 12/2013 | Yamazaki et al. |
| 2014/0286076 A1 | 9/2014 | Aoki et al. |
| 2015/0108467 A1 | 4/2015 | Moriguchi et al. |
| 2017/0184893 A1* | 6/2017 | Saitoh ............... G02F 1/134309 |

FOREIGN PATENT DOCUMENTS

| | | |
|---|---|---|
| JP | 2008-040343 A | 2/2008 |
| JP | 2008-225036 A | 9/2008 |
| JP | 2009-260002 A | 11/2009 |
| JP | 2010-008758 A | 1/2010 |
| JP | 2010-123938 A | 6/2010 |
| JP | 2011-054941 A | 3/2011 |
| JP | 2012-084572 A | 4/2012 |
| JP | 2012-134475 A | 7/2012 |
| JP | 2013-048219 A | 3/2013 |
| JP | 2013-179282 A | 9/2013 |
| JP | 2014-007399 A | 1/2014 |
| JP | 2014-209727 A | 11/2014 |
| WO | 2011/118079 A1 | 9/2011 |
| WO | 2012/086513 A1 | 6/2012 |
| WO | WO-2016006530 A1 * | 1/2016 ............. H01L 21/28 |

* cited by examiner (a)

(b)

(a)

(b)

(a)

(b)

(a)

(b)

ACTIVE MATRIX SUBSTRATE AND METHOD FOR PRODUCING SAME

TECHNICAL FIELD

The present invention relates to an active matrix substrate and a method for manufacturing the same.

BACKGROUND ART

An active matrix substrate used in a liquid crystal display device, or the like, includes a display region having a plurality of pixels, and a region (a non-display region or a bezel region) other than the display region. In the display region, a switching element such as a thin film transistor (hereinafter, a "TFT") is provided for each pixel. Conventionally, TFTs using an amorphous silicon film as the active layer (hereinafter, "amorphous silicon TFTs") and TFTs using a polycrystalline silicon film as the active layer (hereinafter, "polycrystalline silicon TFTs") have been widely used as such switching elements.

It has been proposed in the art to use an oxide semiconductor, instead of an amorphous silicon or a polycrystalline silicon, as the material of the active layer of TFTs. Such TFTs are referred to as "oxide semiconductor TFTs". An oxide semiconductor has a higher mobility than an amorphous silicon. Thus, an oxide semiconductor TFT can operate at a higher speed than an amorphous silicon TFT.

In some cases, peripheral circuits such as driving circuits are monolithically (integrally) formed in the non-display region of an active matrix substrate. By monolithically forming driving circuits, it is possible to realize a narrower non-display region and to realize a cost reduction by simplifying the mounting process. For example, in the non-display region, in some cases, a gate driver circuit is monolithically formed and a source driver circuit is mounted by a COG (Chip on Glass) method.

With devices such as smartphones for which there is a strong demand for realizing a narrower bezel, it has been proposed in the art to monolithically form a demultiplexer circuit such as a source switching (Source Shared Driving: SSD) circuit in addition to the gate driver (e.g., Patent Document No. 1). An SSD circuit is a circuit for distributing video data among a plurality of source lines from a single video signal line from each terminal of the source driver. By carrying the SSD circuit, it is possible to further narrow the region (the terminal portion/interconnect formation region) in the non-display region where terminal portions and interconnects are arranged. Since the number of outputs from the source driver is reduced and the circuit scale can be reduced, it is possible to reduce the cost of the driver IC.

A peripheral circuit such as a driving circuit and an SSD circuit includes TFTs. In the present specification, TFTs arranged as switching elements in the pixels of the display region are referred to as "pixel TFTs", and TFTs that form peripheral circuits are referred to as "circuit TFTs". Of the circuit TFTs, TFTs that form driving circuits are referred to as "driving circuit TFTs", and TETs that are used as switching elements in the demultiplexer circuit (SSD circuit) are referred to as "DMX circuit TFTs".

CITATION LIST

Patent Literature

Patent Document No. 1: International Publication WO2011/118079 pamphlet

SUMMARY OF INVENTION

Technical Problem

With active matrix substrates using oxide semiconductor TFTs as pixel TFTs, it is preferred to form driving circuit TFTs and DMX circuit TFTs using the same oxide semiconductor film as the pixel TFTs and using a common process, in view of the manufacturing process.

However, as a result of a study by the present inventors, the characteristics demanded for DMX circuit TFTs are different from the characteristics demanded for pixel TFTs and driving circuit TFTs. Therefore, oxide semiconductor TFTs that are similar to pixel TFTs and driving circuit TFTs are used as DMX circuit TFTs, it is difficult in some cases to realize a demultiplexer circuit having an intended performance. The details will be described later.

Thus, with an active matrix substrate having a plurality of TFTs of different applications, there is a demand for producing a plurality of oxide semiconductor TFTs having different characteristics by using the same oxide semiconductor film so that each TFT can have required characteristics depending on the application thereof.

Embodiments of the present invention have been made in view of the above, and it is an object of the present invention to provide an active matrix substrate including a plurality of oxide semiconductor TFTs having different characteristics. It is also an object to provide a method for manufacturing an active matrix substrate, wherein it is possible to selectively produce a plurality of oxide semiconductor TFTs having different characteristics by using the same oxide semiconductor film.

Solution to Problem

An active matrix substrate according to one embodiment of the present invention is an active matrix substrate having a display region that includes a plurality of pixels and a non-display region that is provided around the display region, the active matrix substrate including: a substrate; a plurality of first TFTs supported on the substrate and provided in the non-display region; a peripheral circuit including the plurality of first TFTs; a plurality of second TFTs supported on the substrate and provided in the display region or the non-display region; and an inorganic insulating layer that covers the plurality of first TFTs and the plurality of second TFTs, wherein: each of the plurality of first TFTs and the plurality of second TFTs includes: a gate electrode; a gate insulating layer that covers the gate electrode; an oxide semiconductor layer arranged so as to oppose the gate electrode with the gate insulating layer interposed therebetween, the oxide semiconductor layer including a channel region, a source contact region and a drain contact region, wherein the source contact region and the drain contact region are located on opposite sides of the channel region; and a source electrode that is in contact with the source contact region of the oxide semiconductor layer and a drain electrode that is in contact with the drain contact region of the oxide semiconductor layer; the oxide semiconductor layer of the plurality of first TFTs and the plurality of second TFTs is formed from the same oxide semiconductor film; and a carrier concentration in the channel regions of the plurality of first TFTs is higher than a carrier concentration in the channel regions of the plurality of second TFTs.

In one embodiment, the carrier concentration in the channel regions of the plurality of first TFTs is $1 \times 10^{17}/cm^3$ or more and $1 \times 10^{19}/cm^3$ or less.

In one embodiment, the carrier concentration in the channel regions of the plurality of first TFTs is 10 times or more and 1000 times or less the carrier concentration in the channel regions of the plurality of second TFTs.

In one embodiment, the inorganic insulating layer includes a silicon oxide layer that is in contact with the channel regions of the plurality of first TFTs and the plurality of second TFTs; and a first portion of the silicon oxide layer that is located over the plurality of first TFTs contains hydrogen at a higher concentration than a second portion of the silicon oxide layer that is located over the plurality of second TFTs.

In one embodiment, the inorganic insulating layer includes a silicon oxide layer that is in contact with the channel regions of the plurality of first TFTs and the plurality of second TFTs, and a hydrogen supply layer that is arranged on the silicon oxide layer; and the hydrogen supply layer is arranged over a first portion of the silicon oxide layer that is located over the plurality of first TFTs and not arranged over a second portion of the silicon oxide layer that is located over the plurality of second TFTs, or is thicker over the first portion than over the second portion.

In one embodiment, the hydrogen supply layer is a silicon nitride layer.

In one embodiment, a threshold voltage of the plurality of first TFTs is lower than a threshold voltage of the plurality of second TFTs.

In one embodiment, the threshold voltage of the plurality of first TFTs is negative and the threshold voltage of the plurality of second TFTs is positive.

In one embodiment, the peripheral circuit is a demultiplexer circuit.

In one embodiment, the plurality of second TFTs include pixel TFTs respectively arranged in a plurality of pixels.

In one embodiment, the active matrix substrate further includes: a driving circuit provided in the non-display region, wherein the plurality of second TFTs include TFTs of the driving circuit.

In one embodiment, the oxide semiconductor layer includes an In—Ga—Zn—O-based semiconductor.

In one embodiment, the oxide semiconductor layer includes a crystalline portion.

In one embodiment, the oxide semiconductor layer has a layered structure.

A method for manufacturing an active matrix substrate according to one embodiment of the present invention is a method for manufacturing an active matrix substrate having a display region that includes a plurality of pixels and a non-display region that is provided around the display region, the active matrix substrate including a plurality of first TFTs arranged in the non-display region and a plurality of second TFTs arranged in the display region or the non-display region, where a first region refers to a region where each of the plurality of first TFTs is formed, and a second region refers to a region where each of the plurality of second TFTs is formed, the method including the steps of: (A) forming a gate electrode and a gate insulating layer covering the gate electrode on the substrate in each of the first region and the second region; (B) forming an oxide semiconductor film on the gate insulating layer and patterning the oxide semiconductor film to thereby form an oxide semiconductor layer in each of the first region and the second region; (C) forming a conductive film on the oxide semiconductor layer and patterning the conductive film to thereby form a source electrode and a drain electrode that are in contact with the oxide semiconductor layer in each of the first region and the second region, wherein a portion of the oxide semiconductor layer that is in contact with the source electrode is a source contact region, a portion of the oxide semiconductor layer that is in contact with the drain electrode is a drain contact region, and a region that is located between the source contact region and the drain contact region and that opposes the gate electrode with the gate insulating layer interposed therebetween is a channel region; and (D) making a carrier concentration of the channel region of the oxide semiconductor layer formed in the first region higher than a carrier concentration of the channel region of the oxide semiconductor layer formed in the second region.

In one embodiment, the step (D) includes the steps of: (a1) forming a mask that covers the channel region of the oxide semiconductor layer formed in the second region and exposes therethrough the channel region of the oxide semiconductor layer formed in the first region; (a2) performing a plasma treatment from above the mask; and (a3) performing a heat treatment at a temperature of 200° C. or more and 300° C. or less after the plasma treatment.

In one embodiment, the step (D) includes the steps of: (b1) forming a silicon oxide layer that covers the oxide semiconductor layer, the source electrode and the drain electrode in the first region and the second region; (b2) forming a mask that exposes therethrough a first portion of the silicon oxide layer that is located in the first region and covers a second portion of the silicon oxide layer that is located in the second region; (b3) supplying hydrogen from above the mask to make a hydrogen concentration of the first portion of the silicon oxide layer higher than a hydrogen concentration of the second portion of the silicon oxide layer; and (b4) after the step (b3), performing a heat treatment at a temperature of 200° C. or more and 400° C. or less.

In one embodiment, the step (D) includes the steps of: (c1) forming a silicon oxide layer that covers the oxide semiconductor layer, z e source electrode and the drain electrode in the first region and the second region; (c2) forming a hydrogen supply layer over a first portion of the silicon oxide layer that is located in the first region, and not forming the hydrogen supply layer over a second portion of the silicon oxide layer that is located in the second region, or forming the hydrogen supply layer so as to be thicker over the first portion than over the second portion; and (c3) after the step (c2), performing a heat treatment at a temperature of 200° C. or more and 400° C. or less; and the hydrogen supply layer is a silicon nitride layer.

In one embodiment, the oxide semiconductor layer includes an In—Ga—Zn—O-based semiconductor.

In one embodiment, the oxide semiconductor layer includes a crystalline portion.

In one embodiment, the oxide semiconductor layer has a layered structure.

Advantageous Effects of Invention

One embodiment of the present invention provides an active matrix substrate including a plurality of oxide semiconductor TFTs having different characteristics. One embodiment of the present invention provides a method for manufacturing an active matrix substrate, wherein it is possible to selectively produce a plurality of oxide semiconductor TFTs having different characteristics by using the same oxide semiconductor film.

DESCRIPTION OF EMBODIMENTS

Figure 1:
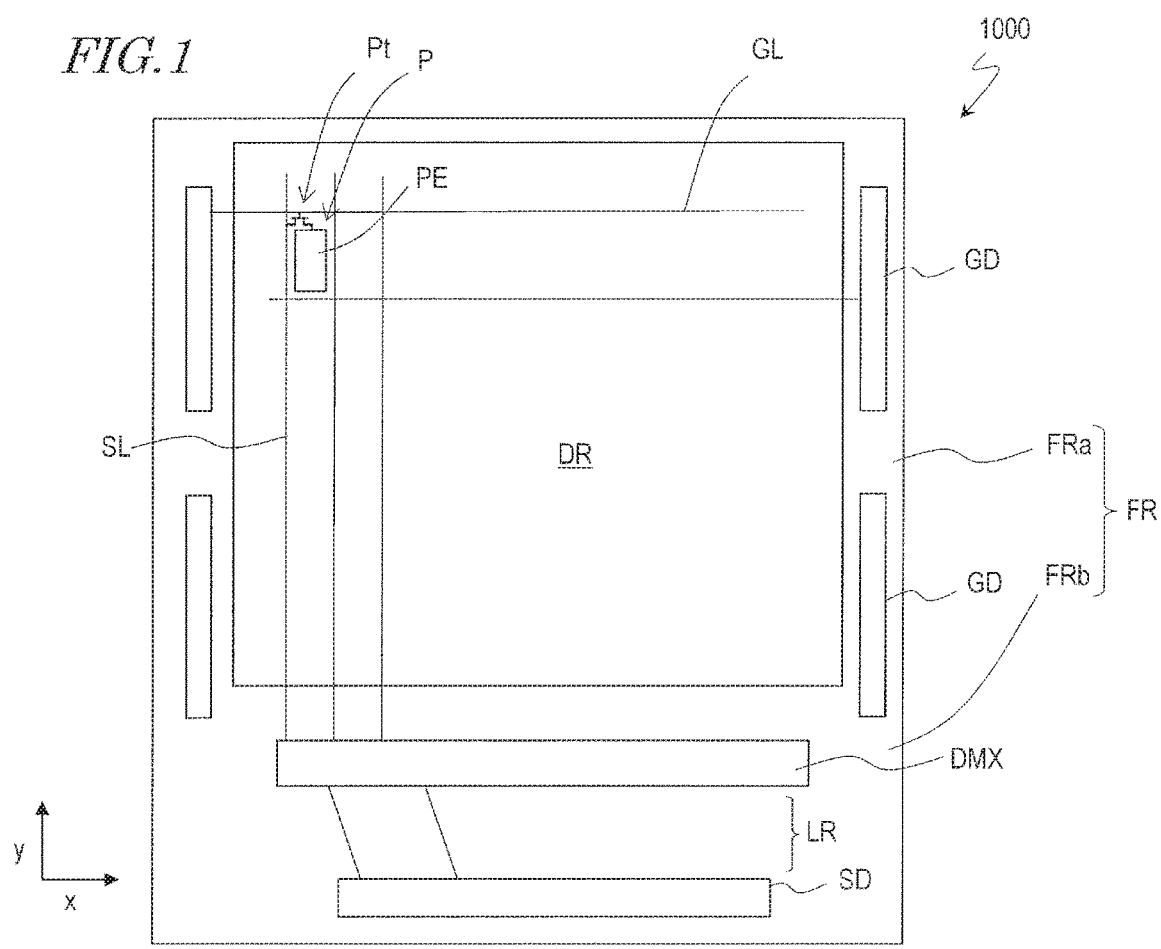
FIG. 1 is a schematic diagram showing an example of a planar structure of an active matrix substrate 1000 of the first embodiment.

Forming DMX circuit TFTs on an active matrix substrate using the same oxide semiconductor film as pixel TFTs and driving circuit TFTs presents the following problems.

A relatively high ON current needs to flow through a DMX circuit TFT, and the DMX circuit TFT is required to have a high current driving force. However, since the mobility of an oxide semiconductor is smaller than that of a polycrystalline silicon by about one order of magnitude, an oxide semiconductor TFT has a lower current driving force than a polycrystalline silicon TFT. Therefore, when a DMX circuit TFT is formed by using an oxide semiconductor, it is difficult in some cases to charge the source bus line in a predetermined amount of time. When the channel width of a TFT is increased in order to ensure an intended current driving force, the size of the TFT increases, and it may be impossible to realize a narrower bezel.

The characteristics demanded for a DMX circuit TFT are different from those demanded for a driving circuit TFT, and they are difficult to achieve at the same time. For example, an enhancement-type TFT whose threshold voltage Vth is positive is normally used as a driving circuit TFT for use in a gate driver for the purpose of preventing a circuit malfunction. With an enhancement-type TFT, however, it is difficult to further increase the ON current, and it may be impossible to suitably apply to a DMX circuit TFT.

Note that forming a plurality of oxide semiconductor TFTs of different applications using the same oxide semiconductor film may cause problems as described above, and they are not limited to DMX circuit TFTs.

In contrast, the present inventors found a method with which it is possible to form a plurality of oxide semiconductor TFT having different carrier concentrations in the channel region, without complicating the manufacturing process, thus arriving at the present invention.

According to one embodiment of the present invention, it is possible to selectively produce a plurality of oxide semiconductor TFTs having different characteristics on the same substrate. For example, the carrier concentration of the oxide semiconductor layer of a DMX circuit TFT can be made higher than the carrier concentration of the oxide semiconductor layer of other TFTs such as a pixel TFT and a driving circuit TFT. As a result, it is possible to lower the threshold voltage of a DMX circuit TFT while maintaining the TFT characteristics of a pixel TFT, a driving circuit TFT, etc., and it is possible to increase the ON current of a DMX circuit TFT. Therefore, it is possible to achieve both the characteristics demanded for a DMX circuit TFT and the characteristics demanded for a driving circuit TFT or a pixel TFT.

First Embodiment

An active matrix substrate of the first embodiment will now be described with reference to the drawings. At least one peripheral circuit is monolithically formed on the active matrix substrate of the present embodiment. The peripheral circuit may be a demultiplexer circuit such as an SSD circuit, for example. An active matrix substrate having an SSD circuit and a gate driver monolithically formed thereon and having a source driver mounted thereon will be described below as an example.

FIG. 1 is a schematic diagram showing an example of a planar structure of an active matrix substrate 1000 of the present embodiment.

The active matrix substrate 1000 includes a display region DR, and a region (a non-display region or a bezel region) FR other than the display region DR. The display region DR includes pixel regions P that are arranged in a matrix pattern. A pixel region P (which may be referred to simply as a "pixel") is a region that corresponds to a pixel of a display device. The non-display region FR is a region that is located around the display region DR and that does not contribute to display.

For example, gate drivers GD, a demultiplexer circuit DMX that functions as an SSD circuit (hereinafter referred to simply as the "demultiplexer circuit DMX"), etc., are integrally (monolithically) provided in the non-display region FR. A source driver SD is mounted on the active matrix substrate 1000, for example. In the illustrated example, the gate drivers GD are arranged in regions FRa that are located on opposite sides with the display region DR interposed therebetween, and the source driver SD is mounted on a region FRb that is located on the lower side of the display region DR. The demultiplexer circuit DMX is arranged in the region FRb between the display region DR and the source driver SD. The region between the demultiplexer circuit DMX and the source driver SD serves as a terminal portion/interconnect formation region LR where a plurality of terminal portions and interconnects are formed.

A plurality of gate bus lines GL extending in the row direction (the x direction) and a plurality of source bus lines SL extending in the column direction (the y direction) are formed in the display region DR. Each pixel region P is defined by a gate bus line GL and a source bus line SL, for example. The gate bus lines GL are connected to the respective terminals of the gate driver GD. The source bus lines SL are connected to the respective terminals of the source driver SD.

Each pixel region P includes a thin film transistor Pt and a pixel electrode PE. The thin film transistor Pt is referred to also as a "pixel TFT". The gate electrode of the thin film transistor Pt is electrically connected to the corresponding gate bus line GL, and the source electrode thereof is electrically connected to the corresponding source bus line SL. The drain electrode is electrically connected to the pixel electrode PE. Where the active matrix substrate 1000 is applied to a display device of a transverse electric field mode, such as an FFS (Fringe Field Switching) mode, an electrode (common electrode) that is commonly used by a plurality of pixels is provided on the active matrix substrate 1000, although not shown in the figures.

A plurality of first TFTs and a plurality of second TFTs are formed on the active matrix substrate 1000 by using the same oxide semiconductor film. The first TFTs and the second TFTs have different characteristics from each other. For example, the threshold voltage of the first TFTs may be higher than the threshold voltage of the second TFTs. The first TFTs include DMX circuit TFTs of the demultiplexer circuit DMX, for example. The second TFTs include pixel TFTs or driving circuit TFTs of the gate driver GD, for example. The second TFTs may include both of driving circuit TFTs and pixel TFTs.

Figure 2:
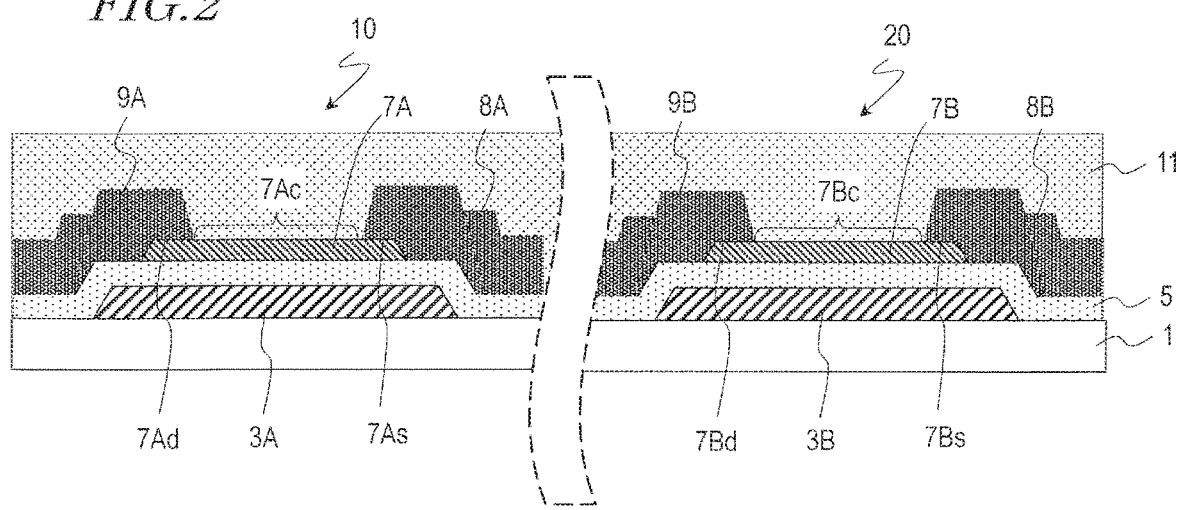
FIG. 2 is a plan view and a cross-sectional view illustrating a first TFT 10 and a second TFT 20 formed on the active matrix substrate 1000.

FIG. 2 is a cross-sectional view illustrating a first TFT 10 and a second TFT 20 formed on the active matrix substrate 1000. Herein, the first TFT 10 is a DMX circuit TFT. The second TFT 20 is a pixel TFT and a driving circuit TFT. The first TFT 10 and the second TFT 20 are oxide semiconductor TFTs of the bottom gate structure whose active layers are formed from the same oxide semiconductor film.

The first TFT 10 is supported on a substrate 1 and formed in the non-display region. The first TFT 10 includes a gate electrode 3A arranged on the substrate 1, a gate insulating layer 5 covering the gate electrode 3A, an oxide semiconductor layer 7A, a source electrode 8A and a drain electrode 9A. The oxide semiconductor layer 7A is arranged on the gate insulating layer 5 so as to at least partially overlap with the gate electrode 3A with the gate insulating layer 5 interposed therebetween. In the present specification, a portion 7As of the oxide semiconductor layer 7A that is in contact with the source electrode 8A will be referred to as the "source contact region", and a portion 7Ad thereof that is in contact with the drain electrode 9A will be referred to as the "drain contact region". As seen from the normal direction to the substrate 1, a region that is located between the source contact region 7As and the drain contact region 7Ad and overlaps with the gate electrode 3A is a "channel region 7Ac".

On the other hand, as with the first TFT 10, the second TFT 20 includes a gate electrode 3B, the gate insulating layer 5, an oxide semiconductor layer 7B, a source electrode 8B and a drain electrode 9B. The oxide semiconductor layer 7B includes a source contact region 7Bs, a drain contact region 7Bd and a channel region 7Bc. The second TFT 20 may be arranged in the display region and function as a pixel TFT, or may be arranged in the non-display region and function as a driving circuit TFT. The planar shape, the size, the channel length L, the channel width W, etc., of different layers may differ between the first TFT 10 and the second TFT 20.

The oxide semiconductor layers 7A and 7B of the first TFT 10 and the second TFT 20 are formed from the same oxide semiconductor film. The "same oxide semiconductor film" as used herein may be a single-layer film or a layered film. The oxide semiconductor layers 7A and 7B may have the same composition ratio (In:Ga:Zn:O where the oxide semi conductor film is an In—Ga—Zn—O-based semiconductor film). The oxide semiconductor layers 7A and 7B may have substantially the same thickness. Herein, "having substantially the same thickness" means that the oxide semiconductor film is not subjected to a process of partially thinning (or thickening) the oxide semiconductor film, and the thicknesses of the oxide semiconductor layers 7A and 7B may be different from each other due to film thickness distributions that occur during the film deposition process.

The source electrodes 8A and 8B and the drain electrodes 9A and 9B of the first TFT 10 and the second TFT 20 may be formed by using the same conductive film as the source bus line SL (FIG. 1). The gate electrodes 3A and 3B may be formed by using the same conductive film as the gate bus line GL (FIG. 1). In the present specification, a layer that is formed by using the same conductive film as the source bus line SL will be referred to as a "source metal layer", and a layer that is formed by using the same conductive film as the gate bus line GL will be referred to as a "gate metal layer".

The first TFT 10 and the second TFT 20 are covered by an inorganic insulating layer 11 that functions as a protection layer (passivation film). In this example, the inorganic insulating layer 11 is arranged so as to be in contact with the upper surfaces of the source electrodes 8A and 8B and the drain electrodes 9A and 9B, and the channel regions 7Ac and 7Bc of the oxide semiconductor layers 7A and 7B.

In the present embodiment, the carrier concentration in the channel region 7Ac of the oxide semiconductor layer 7A of the first TFT 10 (hereinafter, the "first carrier concentration") Ca is higher than the carrier concentration in the channel region 7Bc of the oxide semiconductor layer 7B of the second TFT 20 (the "second carrier concentration") Cb (Ca>Cb). Such a configuration can be realized for example by supplying a reducing gas such as hydrogen or argon to the channel region 7Ac of the first TFT 10. When hydrogen is supplied to an oxide semiconductor, oxygen defects are produced in the oxide semiconductor through the reduction reaction of the oxide semiconductor, thereby producing carrier electrons. As a result, the carrier concentration is increased. Specific methods for varying the carrier concentration between the oxide semiconductor layer 7A and the oxide semiconductor layer 7B will be described later.

As the first carrier concentration Ca of the channel region 7Ac of the first TFT 10 is made higher than the second carrier concentration Cb of the channel region 7Bc of the second TFT 20, the threshold voltage of the first TFT (hereinafter, the "first threshold voltage") Vth(a) becomes lower than the threshold voltage of the second TFT 20 (hereinafter, the "second threshold voltage") Vth(b) (Vth(a) <Vth(b)). By varying the characteristics between the first TFT 10 and the second TFT 20 as described above, it is possible to selectively produce TFTs that are suitably used in SSD circuits and TFTs that are suitably used in driving circuits and pixels.

Note that the first carrier concentration Ca and the second carrier concentration Cb can be measured by using Hall elements, for example. More specifically, Hall elements are produced including oxide semiconductor layers that are formed by employing a process similar to that of the oxide semiconductor layers 7A and 7B included in the first and second TFTs, and the carrier concentrations of the oxide semiconductor layers are obtained from the element characteristics. By obtaining the relationship between the characteristics (e.g., the threshold voltage (Vth), the ON current) of the TFTs including the oxide semiconductor layers 7A and 7B and the carrier concentration obtained from the corresponding Hall element, it is possible to know the relationship between the carrier concentration and the TFT characteristics.

The first TFT 10 may be of a depression type, and the second TFT 20 may be of an enhancement type. Thus, it is possible to further improve the ON current of the first TFT 10 used as a DMX circuit TFT. When the second TFT 20 is used as a driving circuit TFT, it is possible to suppress the occurrence of a circuit malfunction, and it is therefore possible to suppress a decrease in the production yield.

According to the present embodiment, by using the same oxide semiconductor film as pixel TFTs and driving circuit TFTs, it is possible to form DMX circuit TFTs having a lower threshold voltage Vth, i.e., an increased ON current, compared to these TFTs.

Figure 3:
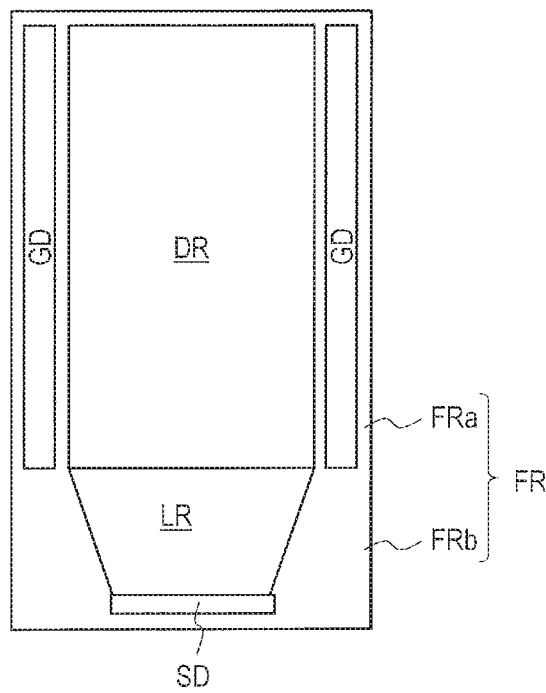
FIGS. 3(a) and 3(b) are schematic plan views illustrating a conventional active matrix substrate without a demultiplexer circuit DMX (SSD circuit) and an active matrix substrate of the present embodiment with a demultiplexer circuit DMX monolithically formed thereon, respectively.
Figure 3:
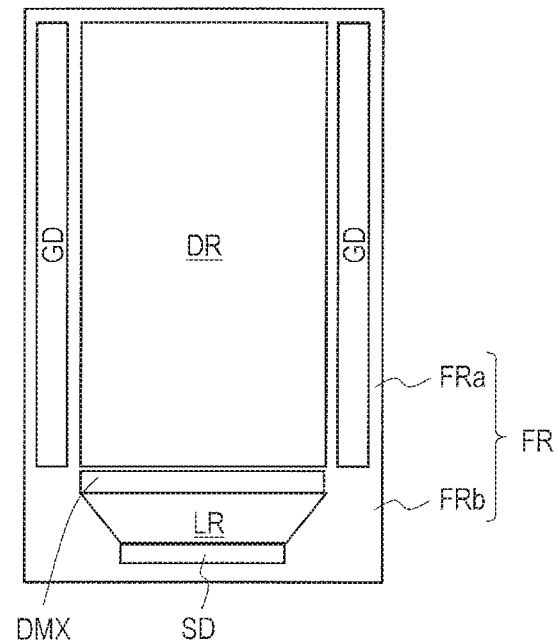

FIGS. 3(*a*) and 3(*b*) are schematic plan views illustrating a conventional active matrix substrate without a demultiplexer circuit DMX (SDD circuit), and an active matrix substrate of the present embodiment with a demultiplexer circuit DMX monolithically formed thereon, respectively.

As described above, it is difficult to realize a demultiplexer circuit DMX by using oxide semiconductor TFTs having similar characteristics to those of driving circuit TFTs, pixel TFTs, and the like. Therefore, in many cases with a conventional display device that uses oxide semiconductor TFTs on the backplane, no demultiplexer circuit DMX is provided on the active matrix substrate. Therefore, as shown in FIG. 3(*a*), a larger area is required for the terminal portion/interconnect formation region LR, and it is not possible to reduce the size of the non-display region FR (particularly, the region FRb). In contrast, according to the present embodiment, it is possible to form the demultiplexer circuit DMX using oxide semiconductor TFTs, without complicating the manufacturing process. As a result, as shown in FIG. 3(*b*), it is possible to significantly reduce the size of the terminal portion/interconnect formation region LR, and it is possible to realize a narrower bezel.

<Method for Manufacturing First TFT 10 and Second TFT 20>

Figure 4:
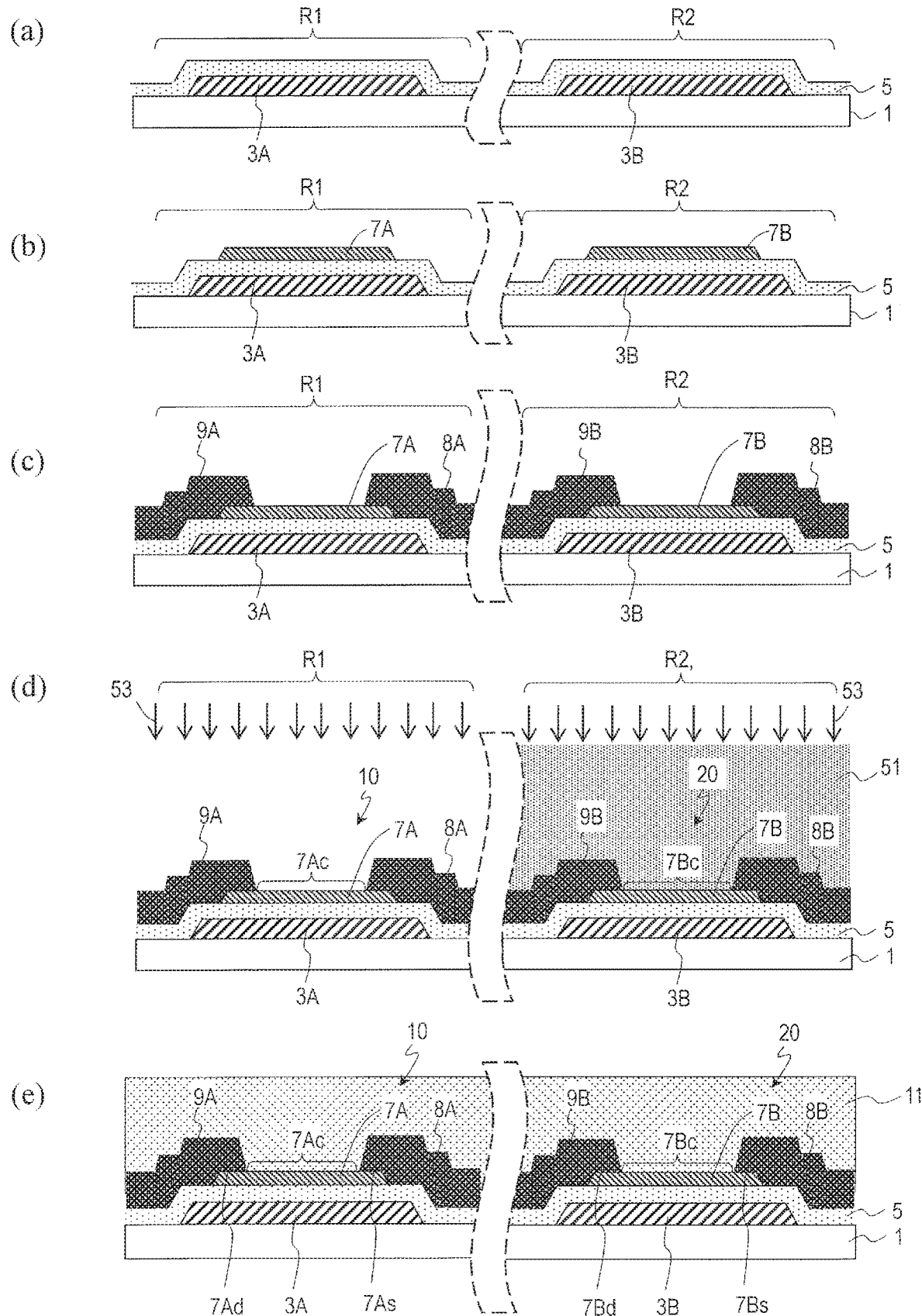
FIGS. 4(a) to 4(e) are step-by-step cross-sectional views illustrating an example of a method for manufacturing the first TFT 10 and the second TFT 20.

FIGS. 4(*a*) to 4(*e*) are step-by-step cross-sectional views illustrating an example of a method for manufacturing the first TFT 10 and the second TFT 20 on the substrate 1, showing a region (hereinafter, a "first region") R1 of the substrate 1 where the first TFT 10 is formed, and a region (hereinafter, a "second region") R2 of the substrate 1 where the second TFT 20 is formed.

First, as shown in FIG. 4(*a*), gate electrodes (thickness: 100 nm to 500 nm, for example) 3A and 3B (which may hereinafter be referred to collectively as the "gate electrode 3") are formed on the substrate 1. Then, a gate insulating layer (thickness: 300 nm to 400 nm, for example) 5 is formed so as to cover the gate electrode 3.

The substrate 1 may be a glass substrate, a silicon substrate, a heat-resistant plastic substrate (resin substrate), etc., for example.

The gate electrode 3 can be formed for example by forming a conductive film on the substrate 1 by a sputtering method, or the like, and then patterning the conductive film by a photolithography known in the art. The conductive film for forming the gate electrode 3 may suitably be a film containing a metal such as aluminum (Al), tungsten (W), molybdenum (Mo), tantalum (Ta), chromium (Cr), titanium (Ti), copper (Cu) and gold (Au), or an alloy thereof, or a metal nitride thereof. It may be a layered film including these films. The layered film may be a film obtained by layering a Ti film, an Al film and a Ti film in this order.

The gate insulating layer 5 can be formed at a temperature of 300° C. to 400° C. using a plasma CVD apparatus, for example. The gate insulating layer 5 may suitably be a silicon oxide (SiO$_2$) layer, a silicon nitride (SiNx) layer, a silicon oxide nitride (SiOxNy; x>y) layer, a silicon nitride oxide (SiNxOy; x>y) layer, or the like. The gate insulating layer 5 may have a layered structure. For example, an SiNx layer may be formed on the substrate side (lower layer) in order to prevent the diffusion of impurities, etc., from the substrate 1, and an SiO$_2$ layer may be formed as a layer thereon (upper layer) in order to ensure insulation.

Then, the oxide semiconductor layers (thickness: 20 nm or more and 100 nm or less, for example) 7A and 7B are formed on the gate insulating layer 5 as shown in FIG. 4(*b*). Specifically, first, an oxide semiconductor film is formed at a temperature of 200 to 400° C. using a sputtering apparatus. Alternatively, an oxide semiconductor film may be formed by an application process. Then, the oxide semiconductor film is patterned by a photolithography known in the art to obtain island-like oxide semiconductor layers 7A and 7B (which may hereinafter be referred to collectively as the "oxide semiconductor layer 7"). The oxide semiconductor layer 7 is arranged so as to overlap with the gate electrode 3 with the gate insulating layer 5 interposed therebetween.

Next, as shown in FIG. 4(*c*), the source electrodes 8A and 8B and the drain electrodes 9A and 9B (which may hereinafter be referred to collectively as the "source electrode 8" and the "drain electrode 9") are formed on the oxide semiconductor layers 7A and 7B, respectively. The thickness of these electrodes is 100 nm to 500 nm, for example.

The source electrode 8 and the drain electrode 9 can be formed for example by forming a conductive film on the oxide semiconductor layer 7 by a sputtering method, or the like, and then patterning the conductive film by a photolithography known in the art. The conductive film may suitably be a film containing a metal such as aluminum (Al), tungsten (W), molybdenum (Mo), tantalum (Ta), copper (Cu), chromium (Cr), titanium (Ti) and gold (Au), or an alloy thereof, or a metal nitride thereof. It may be a layered film including these films. The layered film may be a film obtained by layering a Ti film, an Al film and a Ti film in this order.

Then, as shown in FIG. 4(*d*), a mask (resist layer) 51 that covers the second region R2 and has an opening over the first region R1 is formed. There is no limitation on the mask 51 as long as the mask 51 is shaped so as to cover the channel region 7Bc of the oxide semiconductor layer 7B formed in the second region R2 while exposing the channel region 7Ac of the oxide semiconductor layer 7A formed in the first region R1.

In this state, a plasma treatment is performed from above the mask 51. Herein, a plasma 53 using a reducing gas (a rare gas such as a hydrogen gas or an argon gas) is radiated in a plasma CVD apparatus. The plasma 53 hits a portion (channel region) 7Ac of the oxide semiconductor layer 7A that is exposed between the source electrode 8A and the drain electrode 9A. This produces oxygen defects, thus producing carrier electrons, in the channel region 7Ac, and it is therefore possible to increase the carrier concentration (first carrier concentration) Ca of the channel region 7Ac. On the other hand, the channel region 7Bc, which is protected by the mask 51, is not exposed to the plasma, and the carrier concentration (second carrier concentration) Cb thereof is maintained. Therefore, the first carrier concentration Ca of the channel region 7Ac located in the first region R1 can be made higher than the second carrier concentration Cb of the channel region 7Bc located in the second region R2. Thus, the first TFT 10 and the second TFT 20 are manufactured.

The second carrier concentration Cb of the channel region 7Bc of the second TFT 20 may be $1 \times 10^{19}$/cm$^3$ or more and $1 \times 10^{16}$/cm$^3$ or less, for example, and the first carrier concentration Ca of the channel region 7Ac of the first TFT 10 may be $1 \times 10^{17}$/cm$^3$ or more and $1 \times 10^{19}$/cm$^3$ or less, for example. The first carrier concentration Ca may be 1.0 times or more and 1000 times or less the second carrier concentration Cb. The plasma treatment for increasing the first carrier concentration Ca may be performed for example while setting the hydrogen gas flow rate to 100 to 1000 sccm, the substrate temperature to 200 to 300° C., the RF power to 100 to 200 W and the pressure to 50 to 200 Pa. The plasma treatment time may be 30 s to 200 s, for example. After the plasma treatment, an annealing treatment is performed in the atmosphere at a temperature of 200° C. or more and 300° C. or less for 0.5 to 2 hours. By such a plasma treatment and such an annealing treatment, the carrier concentration (the first carrier concentration Ca) of the channel region 7Ac of the oxide semiconductor layer 7A can be controlled to be within the above range. On the other hand, since the oxide semiconductor layer 7B is protected by the mask (resist layer) from the plasma, the carrier concentration (the second carrier concentration Cb) can be kept low.

Note that Japanese Laid-Open Patent Publication No. 2008-040343, for example, discloses exposing an oxide semiconductor layer to a reducing plasma and reducing the resistance thereof to use it as a conductor (e.g., as pixel electrodes). In contrast, in the present embodiment, the oxide semiconductor layer is subjected to a plasma treatment under such conditions that the resistance is not so much reduced (the carrier concentration is not so much increased) that it can be used as a conductor. Specifically, it is possible to prevent the oxide semiconductor layer from becoming a conductor by shortening the plasma treatment time or by performing the annealing treatment under predetermined conditions after the plasma treatment.

Then, the mask 51 is removed, and the inorganic insulating layer 11 is formed so as to cover the first TFT 10 and the second TFT 20 as shown in FIG. 4(e). The thickness of the inorganic insulating layer 11 is 200 nm or more and 500 nm or less, for example. The inorganic insulating layer 11 can be formed at a temperature of 200° C. to 300° C. using a plasma CVD apparatus, for example.

The inorganic insulating layer 11 may suitably be a silicon oxide ($SiO_2$) layer, a silicon nitride (SiNx) layer, a silicon oxide nitride (SiOxNy; x>y) layer, a silicon nitride oxide (SiNxOy; x>y) layer, or the like. The inorganic insulating layer 11 may have a layered structure. For example, an $SiO_2$ layer may be formed on the substrate side (lower layer), and an SiNx layer may be formed as a layer thereon (upper layer). When an oxygen-containing layer (e.g., an oxide layer such as $SiO_2$) is used for the lower layer, which is in contact with the oxide semiconductor layer 7, it is possible to recover oxygen defects by the oxygen contained in the oxide layer even if excessive oxygen defects occur in the oxide semiconductor layer 7 due to contamination with moisture and impurities from outside, for example.

Then, a heat treatment is performed at a temperature of 200° C. or more and 400° C. or less, for example, in dry air or atmospheric air. The heat treatment time may be 1 to 2 hours, for example. Thus, it is possible to reduce oxygen defects in the oxide semiconductor layer 7 by forming the inorganic insulating layer 11. Note that the heat treatment and the annealing treatment, which is performed after the plasma treatment, may be performed simultaneously.

Although not shown in the figures, an organic insulating layer may be further formed on the inorganic insulating layer 11. The material of the organic insulating layer may be a positive-type photosensitive resin film, for example.

Note that the method for manufacturing the first TFT 10 and the second TFT 20 of the present embodiment is not limited to the method described above. In the present embodiment, after forming the gate electrode 3, the oxide semiconductor layer 7, the source electrode 8 and the drain electrode 9 in each of the first region R1 and the second region R2, a step may be performed to make the carrier concentration of the channel region 7Ac of the oxide semiconductor layer 7A located in the first region R1 higher than the carrier concentration of the channel region 7Bc of the oxide semiconductor layer 7B located in the second region R2. The carrier concentration of the channel region 7Ac may be increased by a method other than the plasma treatment. For example, as will be described in a subsequent embodiment, the carrier concentration of the channel region 7Ac can be increased by supplying hydrogen selectively to a portion of the inorganic insulating layer 11 that is located in the first region R1. Alternatively, the carrier concentration of the channel region 7Ac of the oxide semiconductor layer 7A can be increased selectively by using an insulating layer having a property of reducing an oxide semiconductor (such as an SiNx layer).

<TFT Characteristics>

Figure 5:
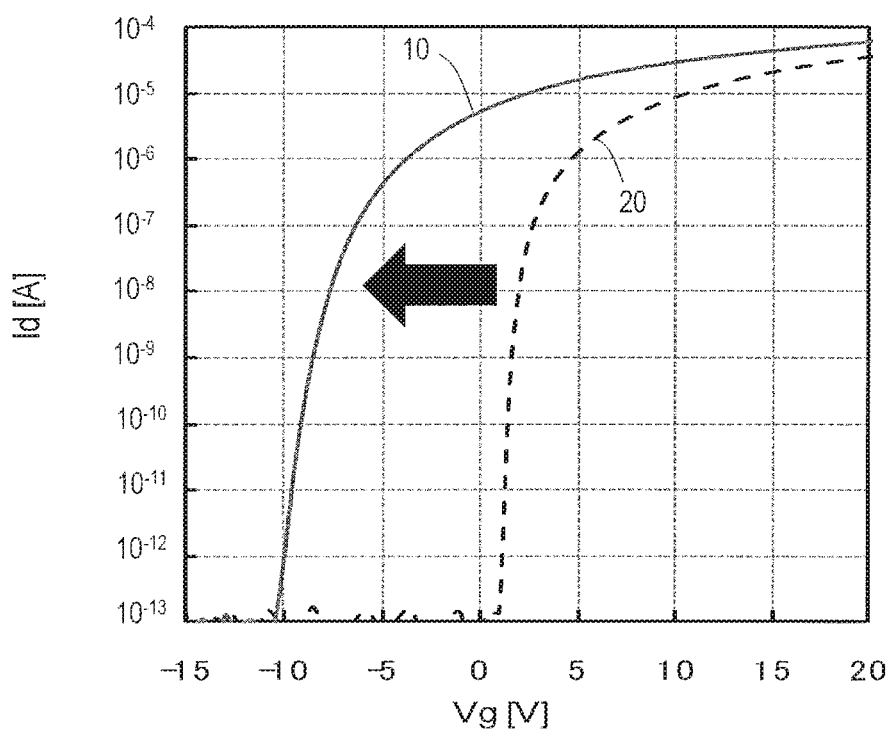
FIGS. 5(a) and 5(b) are graphs illustrating the Vg-Id characteristics of the first TFT 10 and the second TFT 20.
Figure 5:
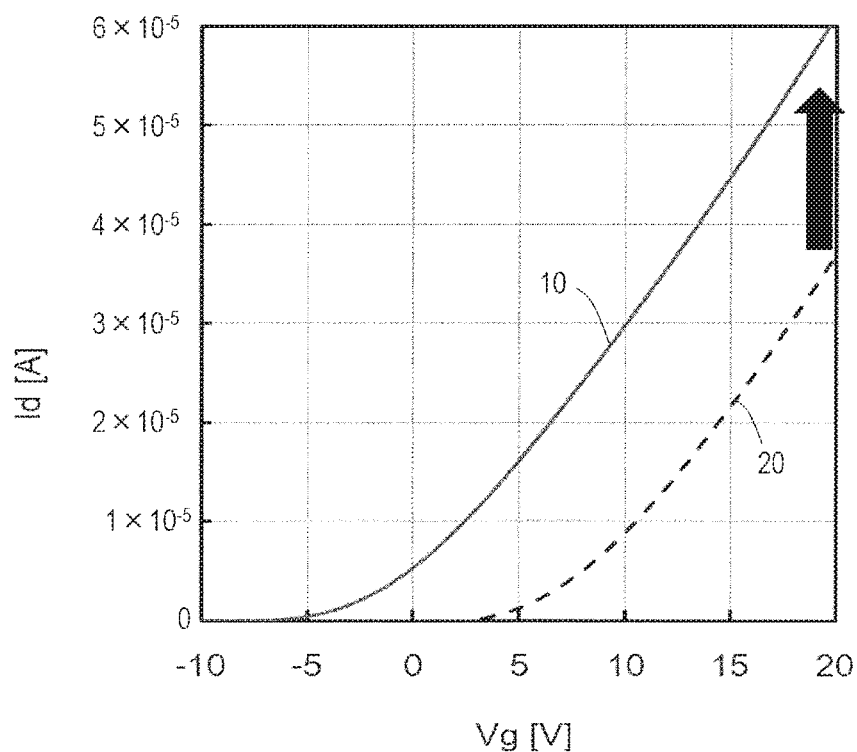

FIGS. 5(a) and 5(b) are graphs illustrating the Vg-Id characteristics of the first TFT 10 and the second TFT 20. The horizontal axis of each graph represents the potential of the gate electrode (gate voltage) Vg with respect to the potential of the drain electrode, and the vertical axis thereof represents the drain current Td. In FIG. 5(a), the vertical axis is logarithmically scaled so that it is easier to understand the threshold voltages Vth(a) and Vth(b) of the first TFT 10 and the second TFT 20.

As can be seen from FIG. 5(a), the threshold voltage Vth(a) of the first TFT 10 is lower than the threshold voltage Vth(b) of the second TFT 20. From this, it can be seen that by performing a plasma treatment on the channel region 7Ac of the first TFT 10 (or a first portion 11A of the inorganic insulating layer 11 that is in contact with the channel region 7Ac), the carrier concentration of the channel region 7Ac is increased, and the threshold voltage Vth is shifted toward the lower voltage side.

The first TFT 10 has depression-type characteristics (Vth (a)<0), and the second TFT 20 has enhancement-type characteristics (Vth(b)>0). Therefore, it is confirmed that by varying the carrier concentration of the channel region based on the presence/absence of the plasma treatment, it is possible to selectively produce depression-type TFTs and enhancement-type TFTs using the same oxide semiconductor film.

As can be seen from FIG. 5(b), with the first TFT 10, the ON current can be made higher than the second TFT 20. Therefore, by using first TFTs 10 as switching elements of the demultiplexer circuit DMX, it is possible to operate the demultiplexer circuit DMX.

On the other hand, the second TFT 20 has enhancement-type characteristics, as with conventional techniques. Therefore, by using second TFTs 20 in a driving circuit such as a gate driver, it is possible to suppress a circuit malfunction and to improve the production yield. It is advantageous to use second TFTs 20 as pixel TFTs because it is then possible to reduce the OFF leak current.

Second Embodiment

An active matrix substrate of the second embodiment will now be described with reference to the drawings. The following description will primarily focus on what is different from the first embodiment, and the description of similar elements to those of the first embodiment will be omitted.

The first TFT 10 and the second TFT 20 of the present embodiment are similarly configured as in FIG. 2. The present embodiment is different from the embodiment described above in that the carrier concentration of the channel region 7Ac of the first TFT 10 is made higher than that of the channel region 7Bc of the second TFT 20 by supplying hydrogen selectively to a portion of the inorganic insulating layer 11 that is located in the first region R1.

Figure 6:
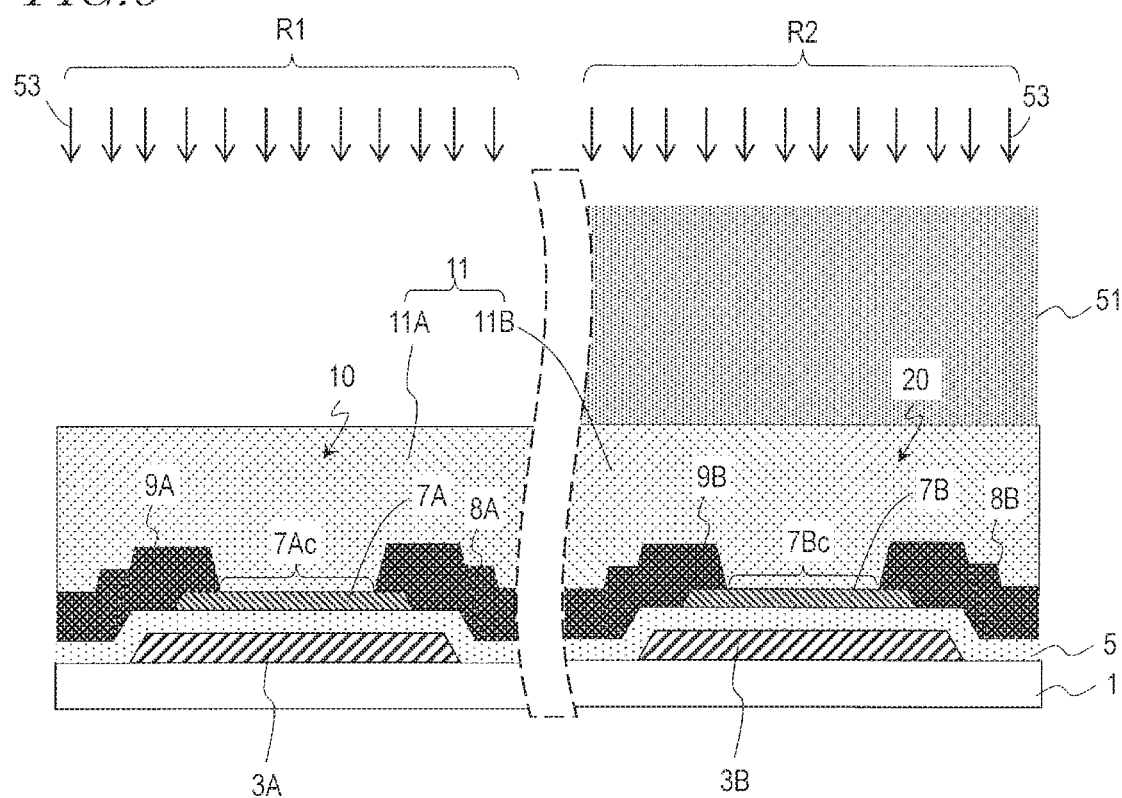
FIG. 6 is a cross-sectional view illustrating a method for manufacturing the first TFT 10 and the second TFT 20 of the second embodiment.

FIG. 6 is a cross-sectional view illustrating a method for manufacturing the first TFT 10 and the second TFT 20 of the present embodiment.

First, the gate electrode 3, the oxide semiconductor layer 7, the source electrode 8 and the drain electrode 9 are formed in each of the first region R1 and the second region R2 by a method similar to that of FIG. 4(*a*) to FIG. 4(*c*). Then, an oxygen-donating layer such as a silicon oxide (SiOx) layer is formed as the inorganic insulating layer 11 in the first region R1 and the second region R2. Herein, an SiO$_2$ layer is formed as the inorganic insulating layer 11. The thickness of the SiO$_2$ layer is 200 nm or more and 500 nm or less, for example.

Then, a mask (resist layer) 51 that covers the second region R2 and has an opening over the first region R1 is formed as shown in FIG. 6. In this state, a plasma treatment is performed from above the mask 51. Herein, a plasma 53 using a reducing gas such as a hydrogen gas is radiated in a plasma CVD apparatus. Thus, hydrogen is introduced into the first portion 11A of the inorganic insulating layer 11 that is located in the first region R1. The introduction of hydrogen is suppressed for the second portion 11B located in the second region R2 since the second portion 11B is protected by the mask 51. Therefore, the first portion 11A of the inorganic insulating layer 11 that is located over the first TFT 10 contains hydrogen at a higher concentration than the second portion 11B located over the second TFT 20. The plasma treatment may be performed for example while setting the hydrogen gas flow rate to 100 to 1000 sccm, the substrate temperature to 200 to 300° C., the RF power to 100 to 1000 W and the pressure to 50 to 200 Pa. The plasma treatment time may be 30 s to 600 s, for example.

Then, a heat treatment is performed for 0.5 to 2 hours (preferably, 1 to 2 hours) at a temperature of 200 to 400° C. (preferably, 200 to 300° C.) in dry air or atmospheric air, by a method similar to the method described above. By the heat treatment, a portion of hydrogen supplied to the first portion 11A of the inorganic insulating layer 11 diffuses to the oxide semiconductor layer 7A. Therefore, the channel region 7Ac, which is in contact with the first portion 11A, is reduced by hydrogen to produce oxygen defects, thereby increasing the carrier concentration. As a result, the first carrier concentration Ca of the channel region 7Ac can be made higher than the second carrier concentration Cb of the channel region 7Bc. Although not shown in the figures, similar Vg-Id characteristics to those of the embodiment described above (FIG. 5) are realized.

Also in the present embodiment, the first carrier concentration Ca may be $1 \times 10^{17}$/cm$^3$ or more and $1 \times 10^{19}$/cm$^3$ or less, for example. The first carrier concentration Ca may be 10 times or more and 1000 times or less the second carrier concentration Cb. The first carrier concentration Ca can be controlled by the treatment conditions of the plasma treatment for the first portion 11A of the inorganic insulating layer 11, for example. For example, the first carrier concentration Ca can be controlled within the range described above by performing a heat treatment at a temperature of 200 to 300° C., for example, after performing the plasma treatment under conditions described above.

Note that the method for supplying hydrogen to the inorganic insulating layer 11 is not limited to the plasma treatment but may be an ion doping method.

Third Embodiment

An active matrix substrate of the third embodiment will now be described with reference to the drawings. The following description will primarily focus on what is different from the first embodiment, and the description of similar elements to those of the first embodiment will be omitted.

Figure 7:
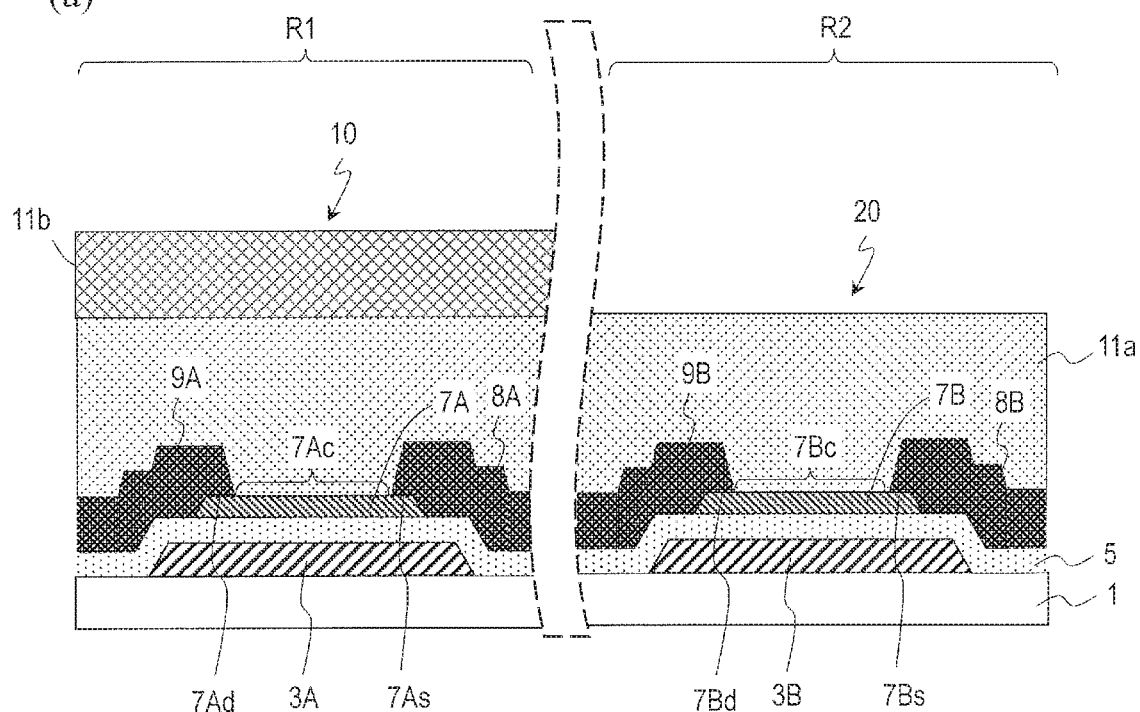
FIGS. 7(a) and 7(b) are cross-sectional views illustrating the first TFT 10 and the second TFT 20 of the third embodiment.
Figure 7:
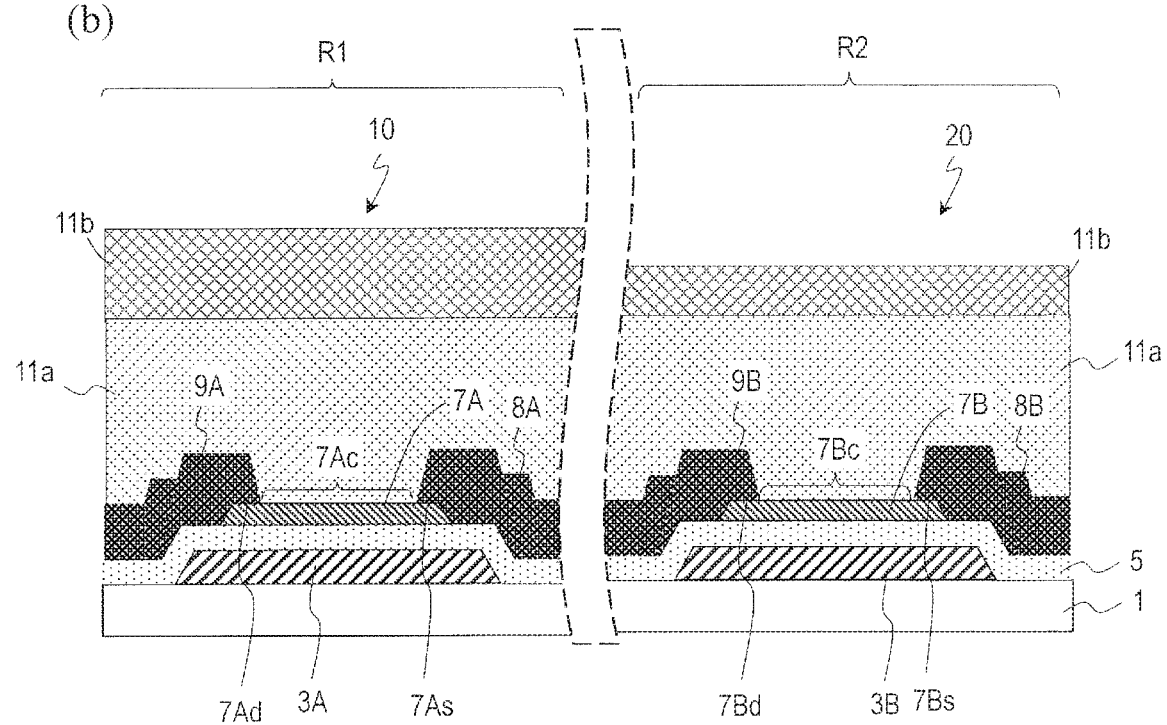

FIGS. 7(*a*) and 7(*b*) are cross-sectional views illustrating the first TFT 10 and the second TFT 20 of the present embodiment.

In the example shown in FIG. 7(*a*), the inorganic insulating layer 11 covering the first TFT 10 and the second TFT 20 has a layered structure including a first layer 11*a* and a second layer 11*b* that is arranged on the first layer 11*a*. The second layer 11*b* is a hydrogen-donating layer (which may be referred to as the "hydrogen supply layer") that is capable of supplying hydrogen. The first layer 11*a* is in contact with the channel regions 7Ac and 7Bc of the first TFT 10 and the second TFT 20. The second layer 11*b* is arranged in the first region R1 and not arranged in the second region R2. The second layer 11*b* may be in contact with the upper surface of the first layer 11*a*.

The second layer 11*b*, which is the hydrogen supply layer, may be a silicon nitride (SINx) layer that primarily contains silicon nitride (SiNx), a silicon nitride oxide (SiNxOy; x>y) layer, or the like. The second layer 11*b* preferably primarily contains silicon nitride.

The first layer 11*a* may be an oxygen-donating layer that is capable of supplying oxygen, for example. The oxygen-donating layer may be a silicon oxide layer that primarily contains silicon oxide (SiOx), for example. The first layer 11*a* is preferably an SiO$_2$ layer that primarily contains SiO$_2$. When an SiO$_2$ layer is used as the first layer 11*a*, it is possible to form a desirable channel interface at the interface with the oxide semiconductor layer 7, and it is therefore possible to further improve the reliability of the TFTs 10 and 20.

In the illustrated example, the hydrogen supply layer is arranged in the first region R1 and not arranged in the second region R2. Therefore, in the first region R1, hydrogen is supplied to the channel region 7Ac of the oxide semiconductor layer 7A via the first layer 11*a* from the second layer 11*b*, which is the hydrogen supply layer. As a result, the channel region 7Ac of the oxide semiconductor layer 7A is reduced by hydrogen, thereby producing oxygen defects. On the other hand, in the second region R2, the second layer 11*b* is not arranged, and substantially no hydrogen is supplied from the second layer 11*b* to the oxide semiconductor layer 7B. Therefore, as in the embodiments described above, the first carrier concentration Ca of the channel region 7Ac can be made higher than the second carrier concentration Cb of the channel region 7Bc.

Also in the present embodiment, the first carrier concentration Ca may be $1 \times 10^{17}$/cm$^3$ or more and $1 \times 10^{19}$/cm$^3$ or less, for example. The first carrier concentration Ca may be 10 times or more and 1000 times or less the second carrier concentration Cb. The carrier concentration of the channel region 7Ac can be controlled by the thicknesses and the materials, etc., of the first layer 11*a* and the second layer 11*b*. As an example, the first layer 11*a* may be an SiO$_2$ layer whose thickness is 50 nm or more and 300 nm or less, and the second layer 11b may be an SiNx layer whose thickness is 100 nm or more and 300 nm or less.

As illustrated in FIG. 7(b), the second layer 11b may be thicker than the second region R2 in the first region R1. Then, the amount of hydrogen supplied from the second layer 11b to the oxide semiconductor layer 7A located in the first region R1 becomes larger than the amount of hydrogen supplied to the oxide semiconductor layer 7B located in the second region R2, and therefore the first carrier concentration Ca of the channel region 7Ac of the oxide semiconductor layer 7A can be made higher than the second carrier concentration Cb of the channel region 7Bc. The thickness of the second layer 11b may be twice or more and five times or less that of the second region R2 in the first region R1.

The first TFT 10 and the second TFT 20 of the present embodiment can be manufactured as follows.

First, the gate electrode 3, the oxide semiconductor layer 7, the source electrode 8 and the drain electrode 9 are formed in each of the first region R1 and the second region R2 by a method similar to that of FIG. 4(a) to FIG. 4(c).

Then, the first layer 11a is formed in the first region R1 and the second region R2. Then, the second layer 11b is formed on the first layer 11a. Herein, a silicon oxide ($SiO_2$) layer is formed as the first layer 11a, and a silicon nitride (SiNx) layer as the second layer 11b.

Then, the second layer 11b is patterned so as to remove a portion of the second layer 11b that is located in the second region R2. The second layer 11b may have an opening over the second region R2 or may be arranged in an island-like pattern over the first region R1.

Alternatively, a portion of the second layer 11b that is located in the second region R2 may be made thinner than a portion thereof that is located in the first region R1 by using a gradation mask such as a halftone mask. In this case, the second layer 11b may include a depressed portion over the second region R2, or may include an island-like protruding portion over the first region R1.

Then, a heat treatment is performed for 1 to 2 hours at a temperature of 200 to 400° C. in dry air or atmospheric air, by a method similar to the method described above. By the heat treatment, a portion of hydrogen present in the second layer 11b diffuses to the oxide semiconductor layer 7A via the first layer 11a. Therefore, the channel region 7Ac is reduced by hydrogen to produce oxygen defects, thereby increasing the carrier concentration. As a result, the carrier concentration of the channel region 7Ac can be made higher than the channel region 7Bc. Although not shown in the figures, similar Vg-Id characteristics to those of the embodiment described above (FIG. 5) are realized.

<TFT Structure>

With the first TFT 10 and the second TFT 20 of any of the first to third embodiments, the source electrode 8 and the drain electrode 9 are arranged so as to be in contact with the upper surface of the oxide semiconductor layer 7 (top contact). However, they may be arranged so as to be in contact with the lower surface of the oxide semiconductor layer 7 (bottom contact). While the first TFT 10 and the second TFT 20 are both channel etch-type TFTs in the embodiments described above, they may be etch stop-type TFTs.

With a "channel etch-type TFT", no etch stop layer is formed over the channel region, and the lower surfaces of the channel-side end portions of the source and drain electrodes are arranged to be in contact with the upper surface of the oxide semiconductor layer, as shown in FIG. 2, for example. Channel etch-type TFTs are formed for example by forming a source-drain electrode conductive film on an oxide semiconductor layer, and performing a source-drain separation. In the source-drain separation step, a surface portion of the channel region is etched in some cases.

Figure 8:
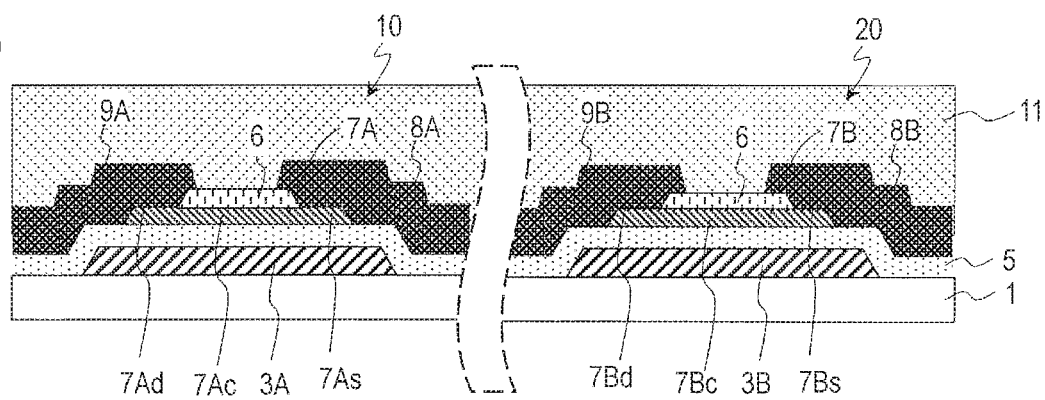
FIGS. 8(a) and 8(b) are a cross-sectional view illustrating another example of the first TFT 10 and the second TFT 20 and a cross-sectional view illustrating a method for manufacturing the same, respectively.
Figure 8:
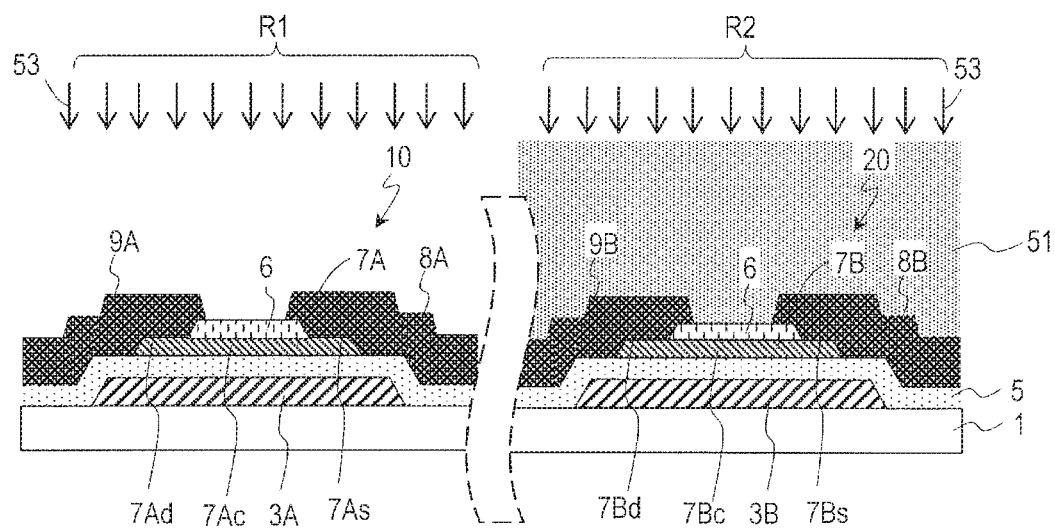

With an "etch stop-type TFT", an etch stop layer 6 is formed on the channel regions 7Ac and 7Bc, as illustrated in FIG. 8(a). The lower surfaces of the channel-side end portions of the source electrodes 8A and 8B and the drain electrodes 9A and 9B are located on the etch stop layer 6, for example.

The etch stop-type first TFTs 10 and second TFTs 20 can be manufactured by a method similar to the method described above with reference to FIG. 4. Note however that after the formation of the oxide semiconductor layers 7A and 7B, the etch stop layer 6 is formed that covers portions of the oxide semiconductor layers 7A and 7B that are to be the channel regions 7Ac and 7Bc. Then, a source-drain electrode conductive film is formed on the oxide semiconductor layers 7A and 7B and the etch stop layer 6, and a source-drain separation is performed, thereby forming the source electrodes 8A and 8B and the drain electrodes 9A and 9B. Then, as illustrated in FIG. 8(b), a plasma treatment is performed with the second region R2 being protected by the mask 51 and the first region R1 being exposed. Herein, a plasma 53 of a hydrogen gas, or the like, is radiated onto a portion of the etch stop layer 6 that is located on the channel region 7Ac. Thus, the hydrogen concentration of a portion of the etch stop layer (e.g., $SiO_2$ layer) 6 that is located on the channel region 7Ac becomes higher than the other portions, and hydrogen is supplied to the channel region 7Ac. Therefore, it is possible to increase the carrier concentration of the channel region 7Ac. Note that as in FIG. 6, a plasma treatment may be performed after the inorganic insulating layer 11 is formed.

<Oxide Semiconductor>

In the embodiment described above, the oxide semiconductor included in the oxide semiconductor layer 7 may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer 7 may have a layered structure including two or more layers. When the oxide semiconductor layer 7 has a layered structure, the oxide semiconductor layer 7 may include a non-crystalline oxide semiconductor layer and a crystalline oxide semiconductor layer. Alternatively, it may include a plurality of crystalline oxide semiconductor layers having different crystalline structures. It may include a plurality of non-crystalline oxide semiconductor layers. When the oxide semiconductor layer has a two-layer structure including an upper layer and a lower layer, it is preferred that the energy gap of the oxide semiconductor included in the upper layer is greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure, the film formation method of the non-crystalline oxide semiconductor and the crystalline oxide semiconductors, and the configuration of an oxide semiconductor layer having a layered structure, etc., are described in Japanese Laid-Open Patent Publication No. 2014-007399, for example. The disclosure of Japanese Laid- Open Patent Publication No. 2014-007399 is herein incorporated by reference in its entirety.

The oxide semiconductor layer 7 may at least include one metal element from among In, Ga and Zn, for example. In the present embodiment, the oxide semiconductor layer 7 includes an In—Ga—Zn—O-based semiconductor (e.g., indium gallium zinc oxide), for example. Now, the In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such an oxide semiconductor layer can be formed from an oxide semiconductor film including an In—Ga—Zn—O-based semiconductor.

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than $\frac{1}{100}$ that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layer 7 may include another oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the oxide semiconductor layer 7 may include an In—Al—Zn—O-based semiconductor, an In—Al—Sn—Zn—O-based semiconductor, a Zn—O-based semiconductor, an In—Zn—C-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, or the like.

(Configuration and Operation of Demultiplexer Circuit)

The first TFTs 10 of the first to third embodiments can suitably be used as switching elements of the demultiplexer circuit DMX (DMX circuit TFTs) provided in the peripheral region of the display device, for example. Herein, the demultiplexer circuit DMX using the first TFTs 10 will be described.

Figure 9:
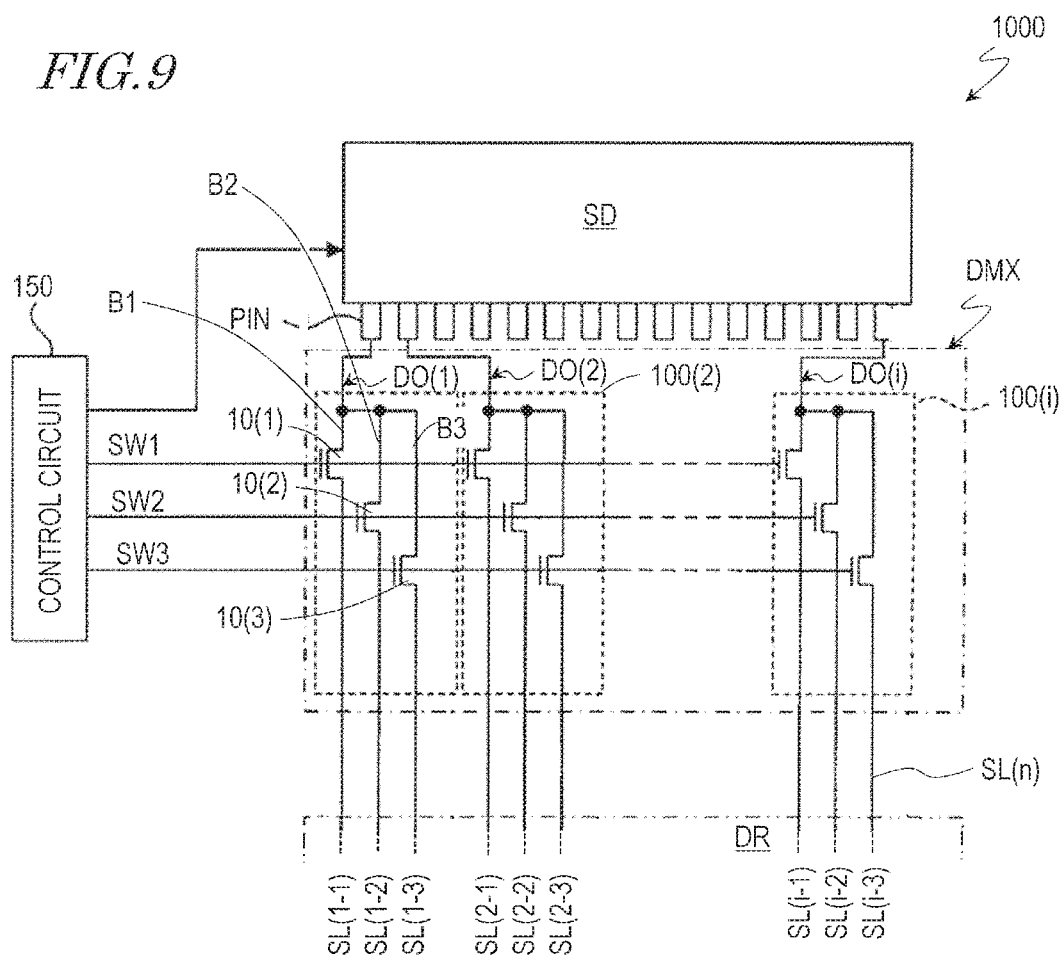
FIG. 9 is a diagram illustrating the configuration and the operation of the demultiplexer circuit DMX.

FIG. 9 is a diagram illustrating the configuration and the operation of the demultiplexer circuit DMX on the active matrix substrate 1000 of the present embodiment.

The demultiplexer circuit DMX is arranged between the source driver SD and the display region DR. The demultiplexer circuit DMX includes a plurality of unit circuits 100(1) to 100(i) (i is an integer that is 2 or more) (which may hereinafter be referred to collectively as the "the unit circuit 100"). The demultiplexer circuit DMX and the source driver SD are controlled by a control circuit 150 provided in the non-display region FR.

One of a plurality of video signal lines DO(1) to DO(i) (which may hereinafter be referred to collectively as the "video signal line DO") is connected to each of the output pins PIN of the source driver SD. A group of n (n is an integer that is 2 or more; herein, n=3) source bus lines SL are associated with one video signal line DO. A unit circuit 100 is provided for each video signal line between the video signal line DO and the group of source bus lines SL. The unit circuit 100 distributes video data from one video signal line DO to n source bus lines SL.

In the present specification, the $N^{th}$ video signal line of the plurality of video signal lines DO(1) to DO(i) is denoted as DO(N) (N is an integer from 1 to i), and the unit circuit 100 and the source bus line SL associated with the video signal line DO(N) are denoted as 100(N) and SL(N–1) to SL(N–n), respectively. The source bus lines SL(N–1) to SL(N–n) may be associated with R, G and B pixels (i.e., n=3), for example.

Each unit circuit 100(N) includes n branch lines B1 to Bn connected to the video signal line DO(N), n control signal lines SW1 to SWn, and n DMX circuit TFTs 10(1) to 30(n) (which may hereinafter be referred to collectively as the "DMX circuit TFT 10"). The control signal lines SW1 to SWn are connected to the control circuit 150.

The DMX circuit TFT 10 functions as a selection switch. The gate electrode of the DMX circuit TFT 10 is electrically connected to a corresponding one of the control signal lines SW1 to SWn. The source electrode of the DMX circuit TFT 10 is electrically connected a corresponding one of the branch lines B1 to Bn. The drain electrode of the DMX circuit TFT 10 is connected to a corresponding one of the source bus lines SL(N–1) to SL(N–3).

Selection signals are supplied from the control signal lines SW1 to SW3 to the gate electrodes of the DMX circuit TFTs 10. Each selection signal defines the ON period of the selection switch within the same group, and is in sync with the chronological signal output from the source driver SD. The unit circuit 100(N) chronologically writes data potentials, which are obtained by time-dividing the output from the video signal line DO(N), to a plurality of source bus lines SL(N–1) to SL(N–n) (time division drive). Thus, it is possible to reduce the number of output pins PIN of the source driver SD, and it is therefore possible to further reduce the area of the non-display region FR (achieving a narrower bezel).

Note that the operation of the display device using the demultiplexer circuit DMX, the timing chart of the time division drive, etc., are disclosed for example in Japanese Laid-Open Patent Publication No. 2008-225036, Japanese Laid-Open Patent Publication No. 2006-119404, International Publication WO2011/118079 pamphlet (Patent Document No. 1), etc. Disclosures of Japanese Laid-Open Patent Publication No. 2008-225036, Japanese Laid-Open Patent Publication No. 2006-119404 and International Publication WO2011/118079 pamphlet are herein incorporated by reference in their entirety.

Figure 10:
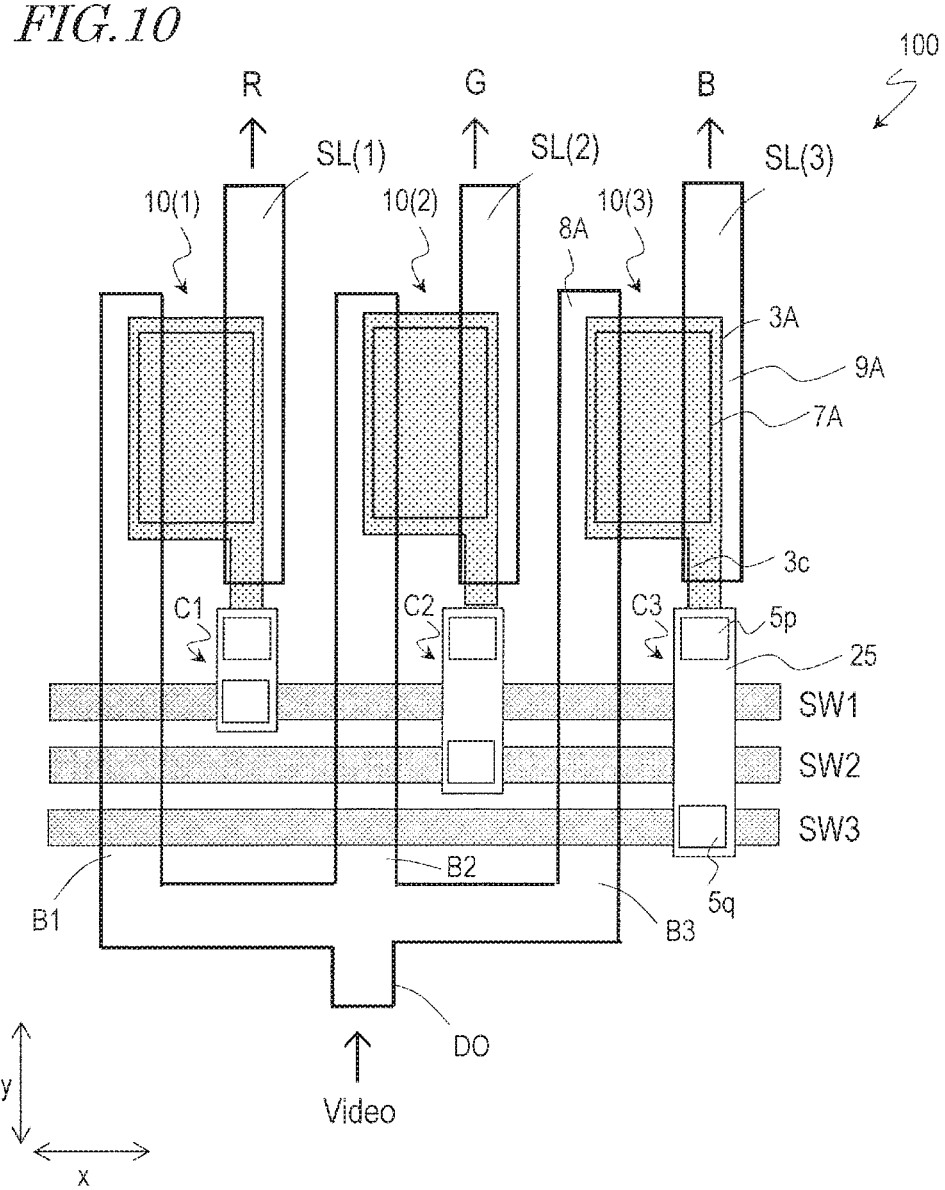
FIG. 10 is a plan view illustrating an unit circuit 100 of the demultiplexer circuit DMX.

FIG. 10 is a plan view illustrating the unit circuit 100 of the present embodiment. Herein, the unit circuit 100 is arranged for the source bus lines SL(1) to SL(3) associated with R, G and B pixels (i.e., n=3).

The unit circuit 100 includes three DMX circuit TETs 10(1) to 10(3) (which may hereinafter be referred to collectively as the "the DMX circuit TFT 10") supported on the substrate 1, source bus line SL(1) to SL(3) (which may hereinafter be referred to collectively as the "source bus line SL") extended from the display region DR, one video signal line DO, the branch lines B1 to B3 (which may hereinafter be referred to collectively as the "branch line B"), and the control signal lines SW1 to SW3 (which may hereinafter be referred to collectively as the "control signal line SW"). The video signal line DO is electrically connected to the branch lines B1 to B3. In this example, the source bus line SL extends in the y direction, and the control signal line SW extends in the x direction, which crosses the y direction. The branch line B and the video signal line DO are formed in the source metal layer. The gate electrode 3 and the control signal line SW are formed in the gate metal layer.

The DMX circuit TFTs 10 each have a structure similar to that of the first TFT 10 described above with reference to FIG. 2 or FIG. 7.

In the present embodiment, each first TFT 10 is arranged between two source bus line SL adjacent to each other. In this example, the first TFT 10 is arranged so that the channel length direction thereof is substantially parallel to the x direction and the channel width direction thereof is substantially parallel to the y direction.

Each source bus line SL extends in the y direction from the display region to the source driver SD side, and is in contact with the upper surface of one end portion of the corresponding oxide semiconductor layer 7 extending in the channel width direction DW. A portion of the source bus line SL that is in contact with the oxide semiconductor layer 7 functions as the drain electrode 9 of the first TFT 10.

Each branch line B extends in the y direction from the video signal line DO to the display region side, and is in contact with the upper surface of the other end portion of the corresponding oxide semiconductor layer 7 extending in the channel width direction DW. A portion of the branch line B that is in contact with the oxide semiconductor layer 7 functions as the source electrode 8 of the DMX circuit TFT 10.

The gate electrode 3 of the DMX circuit TFT 10 is electrically connected to the corresponding control signal line SW. In this example, the gate electrode 3 is provided to extend in the y direction toward the control signal line SW. The extended portion 3c is referred to as the "gate extension portion". At the contact portions C1 to C3, the gate extension portion 3c is electrically connected to the corresponding control signal line SW via a connection line 25 formed in the source metal layer. For example, the connection line 25 may be in contact with the gate extension portion 3c in a first opening 5p provided in the gate insulating layer 5, and may be in contact with the control signal line SW in a second opening 5q provided in the gate insulating layer 5.

(Configuration of Pixel Region P)

Next, the configuration of each pixel region P of the active matrix substrate 1000 will be described. Herein, an active matrix substrate that is used in an LCD panel of an FE'S mode will be described as an example. Each pixel region P includes, as the pixel. TFT, the second TFT 20 described above with reference to FIG. 2 or FIG. 7.

Figure 11:
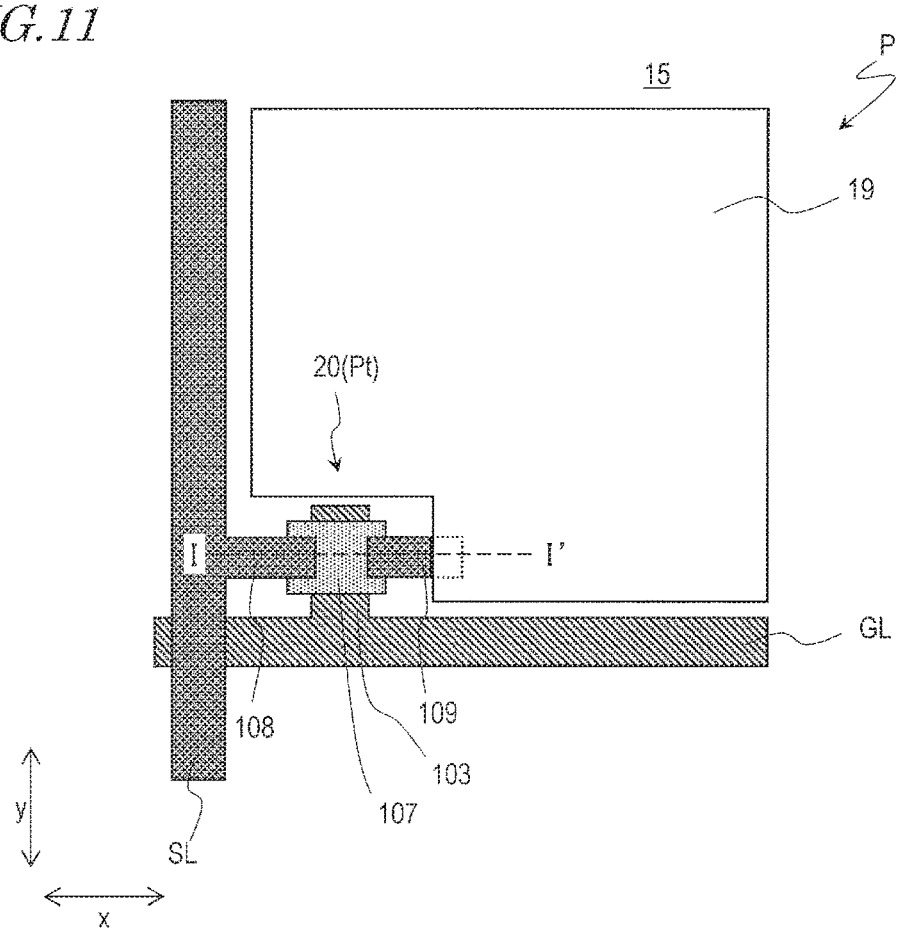
FIGS. 11(a) and 11(b) are a plan view of one pixel region P of the active matrix substrate 1000 and a cross-sectional view thereof taken along line I-I', respectively.
Figure 11:
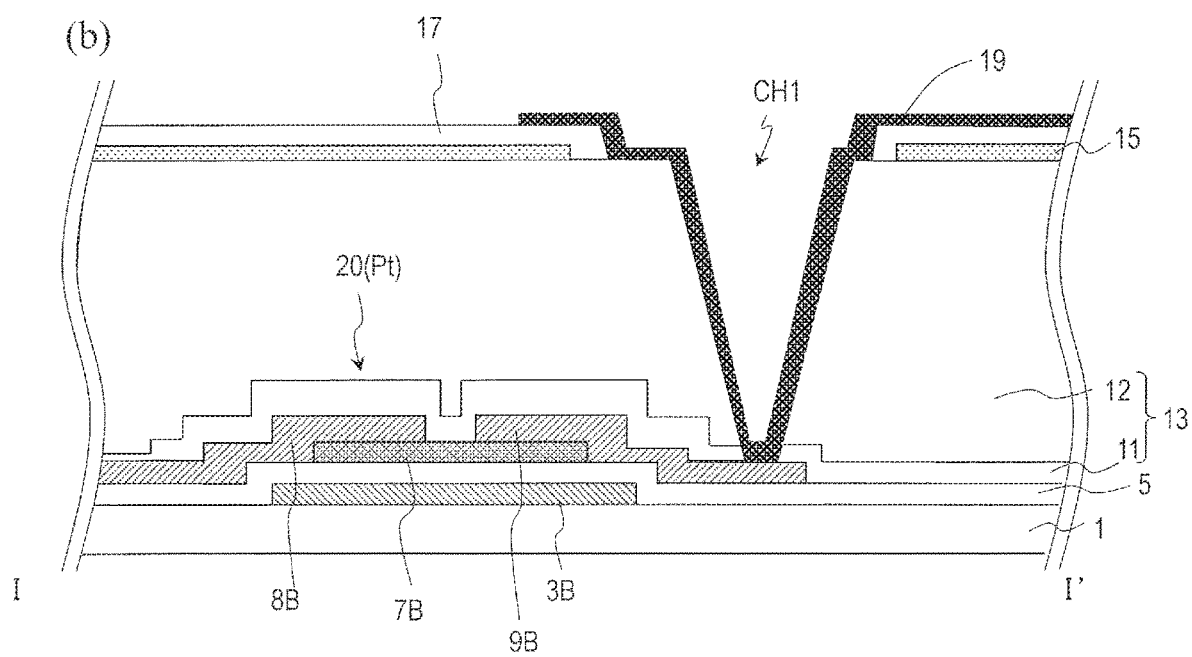

FIGS. 11(a) and 11(b) are a plan view of one pixel region P of the active matrix substrate 1000, and a cross-sectional view thereof taken along line I-I', respectively.

The pixel region P is a region that is surrounded by source bus lines SL extending in the y direction and gate bus lines GL extending in the x direction crossing the source bus lines SL. The pixel region P includes the substrate 1, a thin film transistor (pixel TFT) Pt supported on the substrate 1, a lower transparent electrode 15, and an upper transparent electrode 19. Although not shown in the figures, the upper transparent electrode 19 has a slit or a notch for each pixel. In this example, the lower transparent electrode 15 is the common electrode CE, and the upper transparent electrode 19 is the pixel electrode PE.

The second TFT 20, which is the pixel TFT, has a structure similar to the second TFT 20 shown in FIG. 2 or FIG. 7. The gate electrode 3B of the second TFT 20 is connected to the corresponding gate bus line GL, and the source electrode 8B is connected to the corresponding source bus line SL. The drain electrode 9B is electrically connected to the pixel electrode PE. The gate electrode 3B and the gate bus line GL may be formed integral in the gate metal layer. The source electrode 8B and source bus line SL may be formed integral in the source metal layer.

Although there is no particular limitation, an inter-layer insulating layer 13 may include for example an inorganic insulating layer (passivation film) 11, and an organic insulating layer 12 arranged on the inorganic insulating layer 11. The inorganic insulating layer 11 may be an $SiO_2$ layer or may have a layered structure of an $SiO_2$ layer and an SiNx layer. The inter-layer insulating layer 13 may not include the organic insulating layer 12.

The pixel electrode PE and the common electrode CE are arranged so as to partially overlap with each other with a dielectric layer 17 interposed therebetween. The pixel electrode PE is divided into portions corresponding to pixels. The common electrode CE does not need to be divided into portions corresponding to pixels. In this example, the common electrode CE is formed on the inter-layer insulating layer 13. The common electrode CE may have an opening over a region where the pixel TFT is formed, and may be formed across the entire pixel region P except for this region. The pixel electrode PE is formed on the dielectric layer 17, and is electrically connected to the drain electrode 9B in an opening CH1, which is provided in the inter-layer insulating layer 13 and the dielectric layer 17.

The active matrix substrate 1000 can be applicable to a display device of an FFS mode, for example. The FFS mode is a transverse electric field mode in which a pair of electrodes are provided on one substrate, and an electric field is applied through the liquid crystal molecules in the direction (transverse direction) parallel to the substrate surface. In this example, there is produced an electric field represented by lines of electric force that emerge from the pixel electrode PE, pass through the liquid crystal layer (not shown), and extend to the common electrode CE through the slit-shaped opening of the pixel electrode PE. This electric field has a component that is transverse with respect to the liquid crystal layer. As a result, it is possible to apply a transverse electric field through the liquid crystal layer. The transverse electric field scheme is advantageous in that liquid crystal molecules do not rise from the substrate, thereby realizing a wider viewing angle than the vertical electric field scheme.

An electrode structure in which the pixel electrode PE is arranged on the common electrode CE with the dielectric layer 17 interposed therebetween is described in International Publication WO2012/086513 pamphlet, for example. Note that the common electrode CE may be arranged on the pixel electrode PE with the dielectric layer 17 interposed therebetween. That is, the lower transparent electrode 15 formed on a lower transparent conductive layer M3 may be the pixel electrode PE, and the upper transparent electrode 19 formed on an upper transparent conductive layer M4 may be the common electrode CE. Such an electrode structure is described for example in Japanese Laid-Open Patent Publication No. 2008-032699 and Japanese Laid-Open Patent Publication No. 2010-008758. Disclosures of International.

Publication WO2012/086513 pamphlet, Japanese Laid-Open Patent Publication No. 2008-032899 and Japanese Laid-Open Patent Publication No. 2010-008758 are herein incorporated by reference in their entirety.

INDUSTRIAL APPLICABILITY

The embodiments of the present invention can suitably applied to an active matrix substrate having a peripheral circuit monolithically formed thereon. Such an active matrix substrate is applicable to display devices such as liquid crystal display devices, organic electroluminescence (EL) display devices, inorganic electroluminescent display devices, image pickup devices such as image sensor devices, and various electronic devices such as image input devices, fingerprint reader devices and semiconductor memory devices.

REFERENCE SIGNS LIST

1: Substrate
3, 3A, 3B: Gate electrode
5: Gate insulating layer
7, 7A, 7B: Oxide semiconductor layer
7Ac, 7Bc: Channel region
7Ad, 7Bd: Drain contact region
7As, 7Bs: Source contact region
8, 8A, 8B: Source electrode
9, 9A, 9B: Drain electrode
10: First TFT
20: Second TFT
11: Inorganic insulating layer
11A: First portion of inorganic insulating layer
11B: Second portion of inorganic insulating layer
11a: First layer of inorganic insulating layer
11b: Second layer of inorganic insulating layer
12: Organic insulating layer
13: Inter-layer insulating layer
15: Lower transparent electrode
17: Dielectric layer
19: Upper transparent electrode
25: Connection line
51: Mask
53: Plasma
100: Unit circuit of demultiplexer circuit
150: Control circuit
CE: Common electrode
DMX: Demultiplexer circuit
DR: Display region
FR: Non-display region
LR: Terminal portion/interconnect formation region
GD: Gate driver
GL: Gate bus line
SD: Source driver
SL: Source bus line
P: Pixel region
PE: Pixel electrode
Pt: Thin film transistor
R1: First region
R2: Second region

The invention claimed is:

1. An active matrix substrate having a display region that includes a plurality of pixels and a non-display region that is provided around the display region, the active matrix substrate comprising:
a substrate;
a plurality of first thin-film transistors (TFTs) supported on the substrate and provided in the non-display region;
a peripheral circuit including the plurality of first TFTs;
a plurality of second TFTs supported on the substrate and provided in the display region or the non-display region; and
an inorganic insulating layer that covers the plurality of first TFTs and the plurality of second TFTs, wherein:
each of the plurality of first TFTs and the plurality of second TFTs includes:
a gate electrode;
a gate insulating layer that covers the gate electrode;
an oxide semiconductor layer arranged so as to oppose the gate electrode with the gate insulating layer interposed therebetween, the oxide semiconductor layer including a channel region, a source contact region and a drain contact region, wherein the source contact region and the drain contact region are located on opposite sides of the channel region; and
a source electrode that is in contact with the source contact region of the oxide semiconductor layer and a drain electrode that is in contact with the drain contact region of the oxide semiconductor layer;
the oxide semiconductor layer of the plurality of first TFTs and the plurality of second TFTs is formed from the same oxide semiconductor film;
a carrier concentration in the channel regions of the plurality of first TFTs is higher than a carrier concentration in the channel regions of the plurality of second TFTs; and
the carrier concentration in the channel regions of the plurality of first TFTs is 10 times or more and 1000 times or less the carrier concentration in the channel regions of the plurality of second TFTs.

2. The active matrix substrate according to claim 1, wherein the carrier concentration in the channel regions of the plurality of first TFTs is $1 \times 10^{17}/cm^3$ or more and $1 \times 10^{19}/cm^3$ or less.

3. The active matrix substrate according to claim 1, wherein:
the inorganic insulating layer includes a silicon oxide layer that is in contact with the channel regions of the plurality of first TFTs and the plurality of second TFTs; and
a first portion of the silicon oxide layer that is located over the plurality of first TFTs contains hydrogen at a higher concentration than a second portion of the silicon oxide layer that is located over the plurality of second TFTs.

4. The active matrix substrate according to claim 1, wherein a threshold voltage of the plurality of first TFTs is lower than a threshold voltage of the plurality of second TFTs.

5. The active matrix substrate according to claim 4, wherein the threshold voltage of the plurality of first TFTs is negative and the threshold voltage of the plurality of second TFTs is positive.

6. The active matrix substrate according to claim 1, wherein the peripheral circuit is a demultiplexer circuit.

7. The active matrix substrate according to claim 1, wherein the plurality of second TFTs include pixel TFTs respectively arranged in a plurality of pixels.

8. The active matrix substrate according to claim 1, further comprising:
a driving circuit provided in the non-display region, wherein the plurality of second TFTs include TFTs of the driving circuit.

9. The active matrix substrate according to claim 1, wherein the oxide semiconductor layer has a layered structure.

10. The active matrix substrate according to claim 1, wherein:
the inorganic insulating layer includes a silicon oxide layer that is in contact with the channel regions of the plurality of first TFTs and the plurality of second TFTs, and a hydrogen supply layer that is arranged on the silicon oxide layer; and
the hydrogen supply layer is arranged over a first portion of the silicon oxide layer that is located over the plurality of first TFTs and not arranged over a second portion of the silicon oxide layer that is located over the plurality of second TFTs, or is thicker over the first portion than over the second portion.

11. The active matrix substrate according to claim 10, wherein the hydrogen supply layer is a silicon nitride layer.

12. The active matrix substrate according to claim 1, wherein the oxide semiconductor layer includes an In—Ga—Zn—O-based semiconductor.

13. The active matrix substrate according to claim 12, wherein the oxide semiconductor layer includes a crystalline portion.

14. A method for manufacturing an active matrix substrate having a display region that includes a plurality of pixels and a non-display region that is provided around the display region, the active matrix substrate comprising a plurality of first thin-film transistors (TFTs) arranged in the non-display region and a plurality of second TFTs arranged in the display region or the non-display region, where a first region refers to a region where each of the plurality of first TFTs is formed, and a second region refers to a region where each of the plurality of second TFTs is formed, the method comprising the steps of:
(A) forming a gate electrode and a gate insulating layer covering the gate electrode on the substrate in each of the first region and the second region;
(B) forming an oxide semiconductor film on the gate insulating layer and patterning the oxide semiconductor film to thereby form an oxide semiconductor layer in each of the first region and the second region;
(C) forming a conductive film on the oxide semiconductor layer and patterning the conductive film to thereby form a source electrode and a drain electrode that are in contact with the oxide semiconductor layer in each of the first region and the second region, wherein a portion of the oxide semiconductor layer that is in contact with the source electrode is a source contact region, a portion of the oxide semiconductor layer that is in contact with the drain electrode is a drain contact region, and a region that is located between the source contact region and the drain contact region and that opposes the gate electrode with the gate insulating layer interposed therebetween is a channel region; and
(D) making a carrier concentration of the channel region of the oxide semiconductor layer formed in the first region higher than a carrier concentration of the channel region of the oxide semiconductor layer formed in the second region, wherein:
the step (D) includes the steps of:
(a1) forming a mask that covers the channel region of the oxide semiconductor layer formed in the second region and exposes therethrough the channel region of the oxide semiconductor layer formed in the first region;
(a2) performing a plasma treatment from above the mask; and
(a3) performing a heat treatment at a temperature of 200° C. or more and 300° C. or less after the plasma treatment.

15. The method for manufacturing an active matrix substrate according to claim 14, wherein the oxide semiconductor layer includes an In—Ga—Zn—O-based semiconductor.

16. The method for manufacturing an active matrix substrate according to claim 15, wherein the oxide semiconductor layer includes a crystalline portion.

17. An active matrix substrate having a display region that includes a plurality of pixels and a non-display region that is provided around the display region, the active matrix substrate comprising:
a substrate;
a plurality of first thin-film transistors (TFTs) supported on the substrate and provided in the non-display region;
a peripheral circuit including the plurality of first TFTs;
a plurality of second TFTs supported on the substrate and provided in the display region or the non-display region; and
an inorganic insulating layer that covers the plurality of first TFTs and the plurality of second TFTs, wherein:
each of the plurality of first TFTs and the plurality of second TFTs includes:
a gate electrode;
a gate insulating layer that covers the gate electrode;
an oxide semiconductor layer arranged so as to oppose the gate electrode with the gate insulating layer interposed therebetween, the oxide semiconductor layer including a channel region, a source contact region and a drain contact region, wherein the source contact region and the drain contact region are located on opposite sides of the channel region; and
a source electrode that is in contact with the source contact region of the oxide semiconductor layer and a drain electrode that is in contact with the drain contact region of the oxide semiconductor layer,
the oxide semiconductor layer of the plurality of first TFTs and the plurality of second TFTs is formed from the same oxide semiconductor film,
a carrier concentration in the channel regions of the plurality of first TFTs is higher than a carrier concentration in the channel regions of the plurality of second TFTs,
the inorganic insulating layer includes a silicon oxide layer that is in contact with the channel regions of the plurality of first TFTs and the plurality of second TFTs, and
a first portion of the silicon oxide layer that is located over the plurality of first TFTs contains hydrogen at a higher concentration than a second portion of the silicon oxide layer that is located over the plurality of second TFTs.

18. The active matrix substrate according to claim 17, wherein the oxide semiconductor layer includes an In—Ga—Zn—O-based semiconductor.

19. The active matrix substrate according to claim 17, wherein the oxide semiconductor layer includes a crystalline portion.

* * * * *